United States Patent
Huang et al.

(10) Patent No.: US 12,424,586 B2
(45) Date of Patent: Sep. 23, 2025

(54) BRIDGING-RESISTANT MICROBUMP STRUCTURES AND METHODS OF FORMING THE SAME

(71) Applicant: Taiwan Semiconductor Manufacturing Company Limited, Hsinchu (TW)

(72) Inventors: Han-Hsiang Huang, Hsinchu (TW); Yen-Hao Chen, Taichung (TW); Chien-Sheng Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 575 days.

(21) Appl. No.: 17/837,181

(22) Filed: Jun. 10, 2022

(65) Prior Publication Data
US 2023/0411345 A1    Dec. 21, 2023

(51) Int. Cl.
*H01L 23/00*    (2006.01)

(52) U.S. Cl.
CPC .............. *H01L 24/81* (2013.01); *H01L 24/05* (2013.01); *H01L 24/11* (2013.01); *H01L 24/13* (2013.01); *H01L 24/16* (2013.01); *H01L 24/97* (2013.01); *H01L 2224/0401* (2013.01); *H01L 2224/05566* (2013.01); *H01L 2224/11462* (2013.01); *H01L 2224/13584* (2013.01); *H01L 2224/16227* (2013.01); *H01L 2224/81193* (2013.01); *H01L 2224/95001* (2013.01); *H01L 2224/97* (2013.01); *H01L 2924/01028* (2013.01); *H01L 2924/3841* (2013.01)

(58) Field of Classification Search
CPC ......... H01L 24/81; H01L 24/05; H01L 24/97; H01L 2224/0401; H01L 2224/05566; H01L 2924/01028; H01L 2924/3841
See application file for complete search history.

(56) References Cited

U.S. PATENT DOCUMENTS

2021/0082850 A1*    3/2021    Chang ................ H01L 24/14

* cited by examiner

*Primary Examiner* — Samuel A Gebremariam
(74) *Attorney, Agent, or Firm* — The Marbury Law Group, PLLC

(57) ABSTRACT

A bonded assembly including a first structure and a second structure is provided. The first structure includes first metallic connection structures surrounded of which a passivation dielectric layer includes openings therein, and first metallic bump structures having a respective first horizontal bonding surface segment that is vertically recessed from a first horizontal plane including a distal horizontal surface of the passivation dielectric layer. The second structure includes second metallic bump structures having a respective second horizontal bonding surface segment that protrudes toward the first structure. The first metallic bump structures is bonded to the second metallic bump structures through solder material portions.

20 Claims, 47 Drawing Sheets

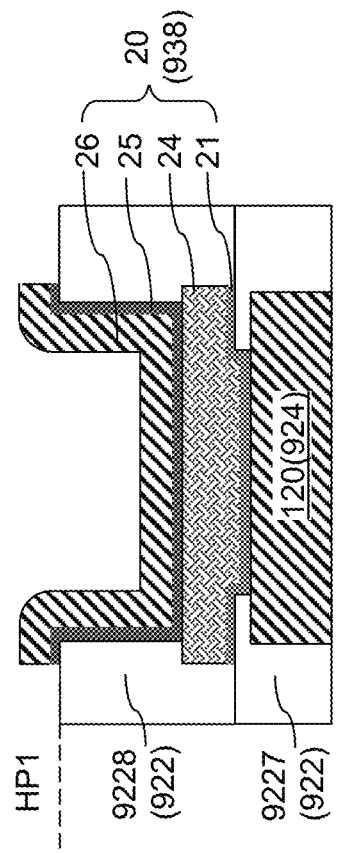
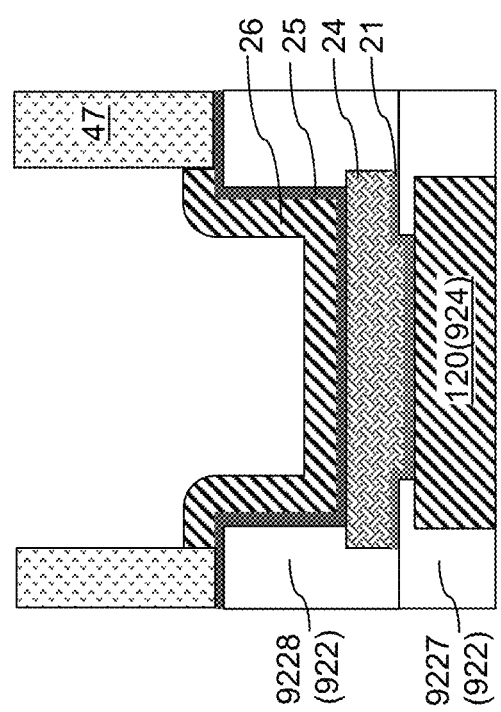
FIG. 3H
FIG. 3G

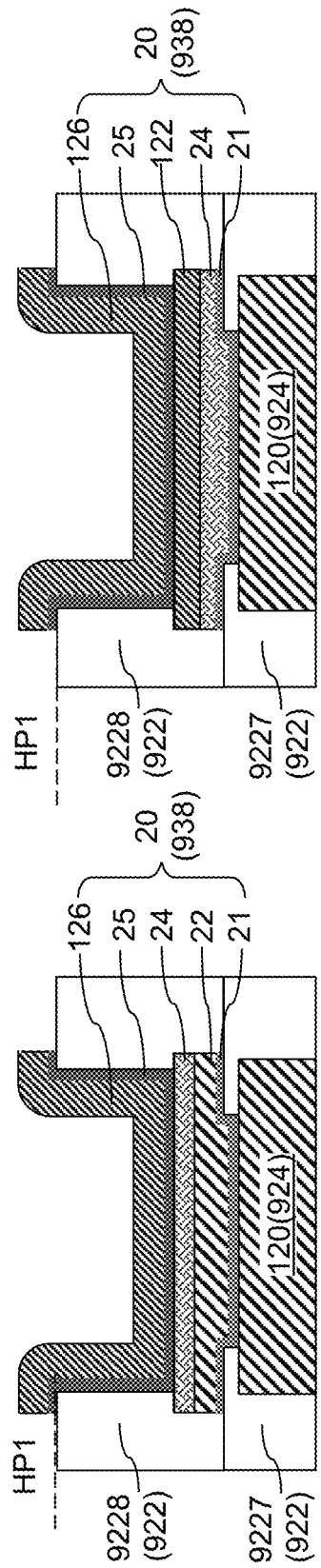

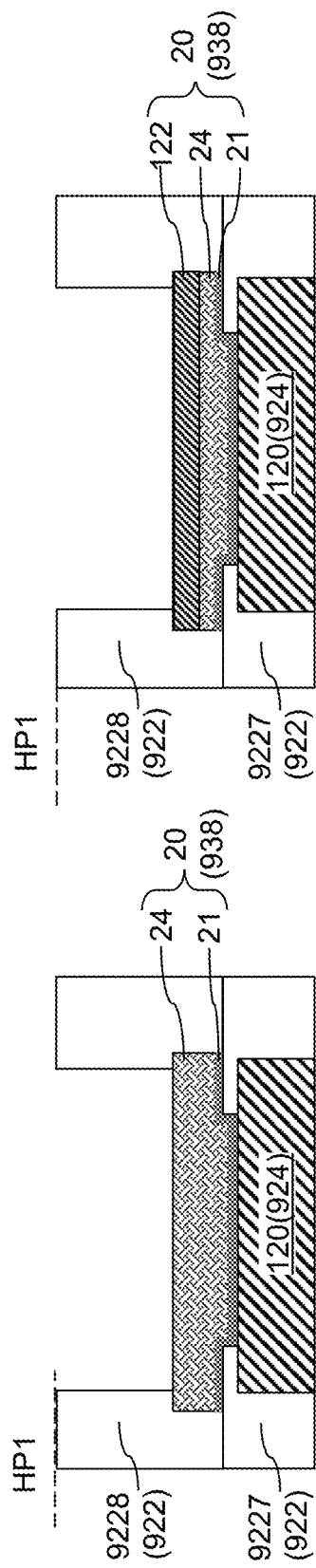

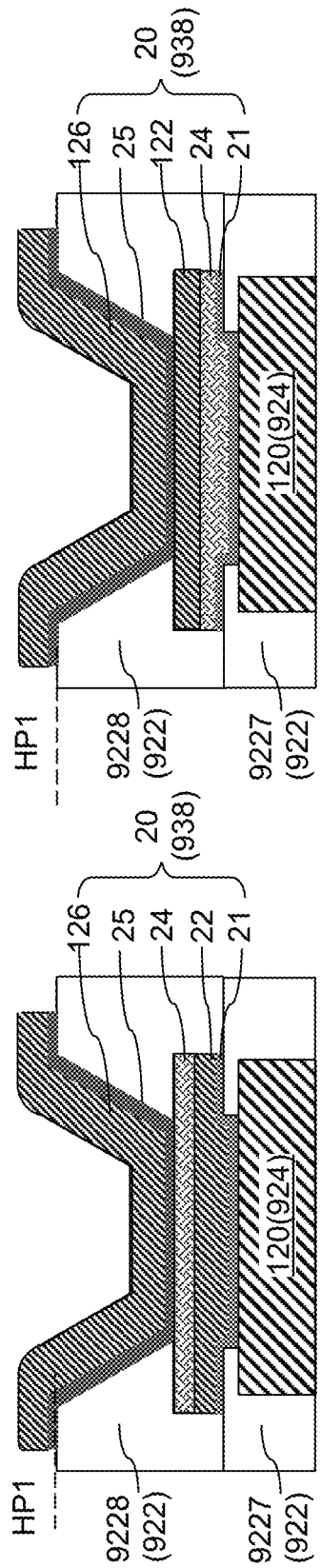

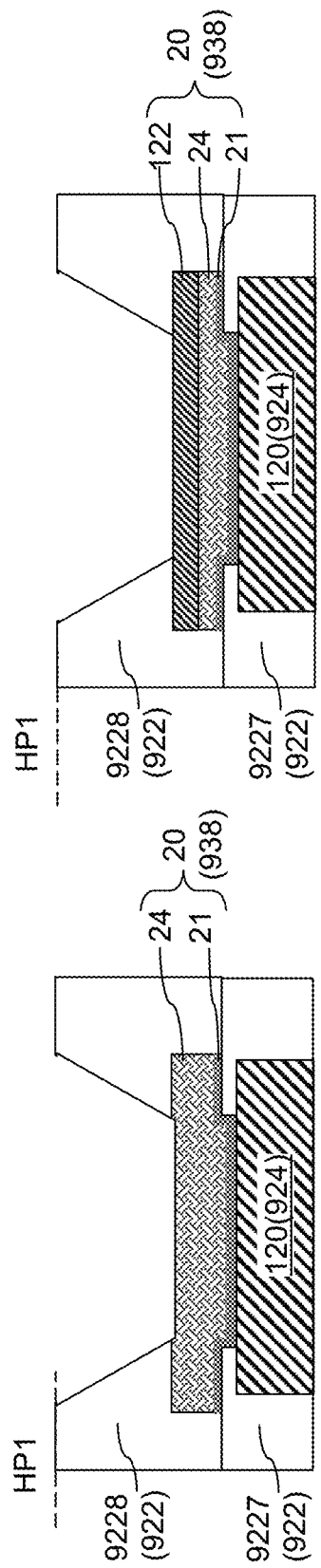

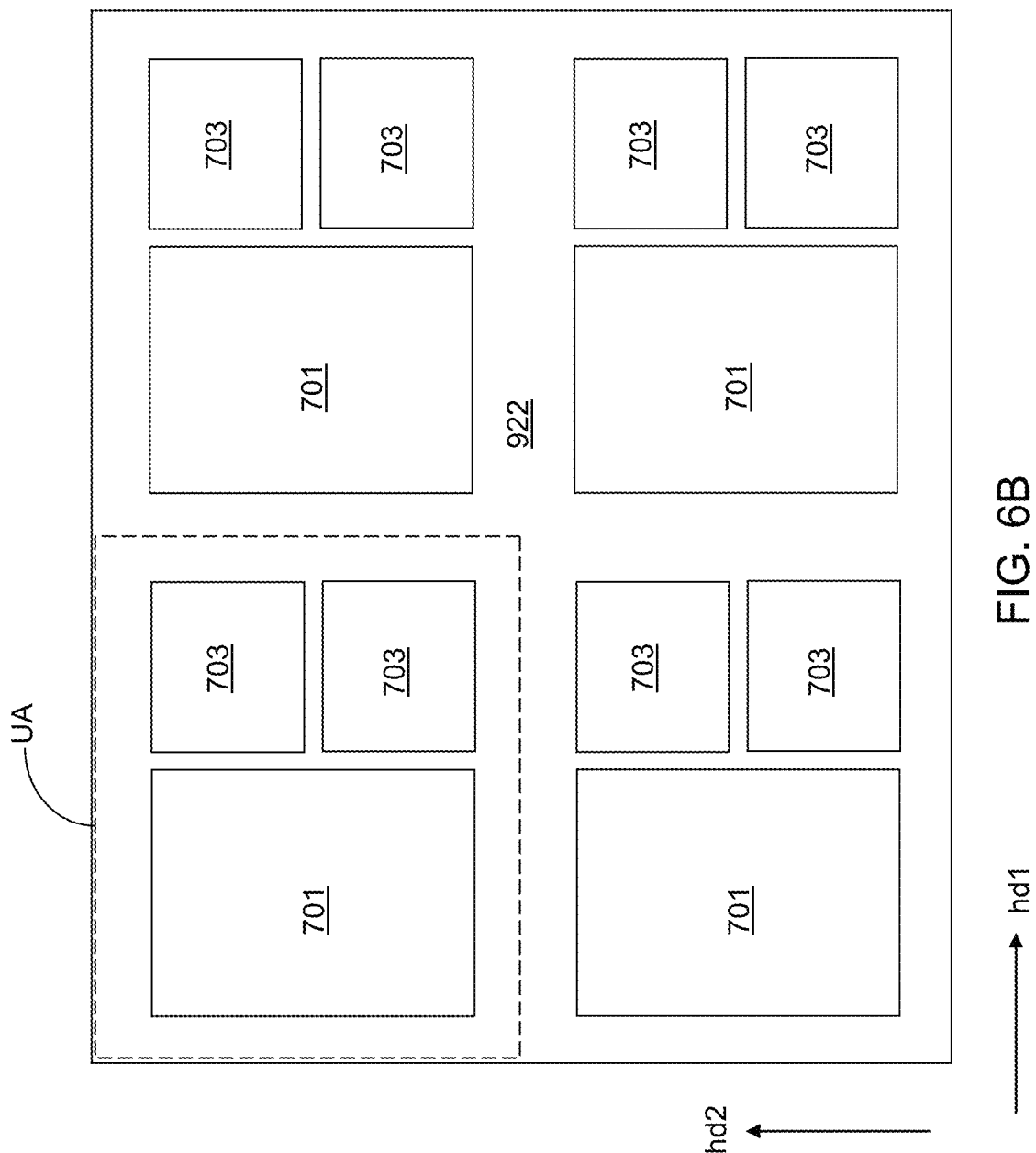

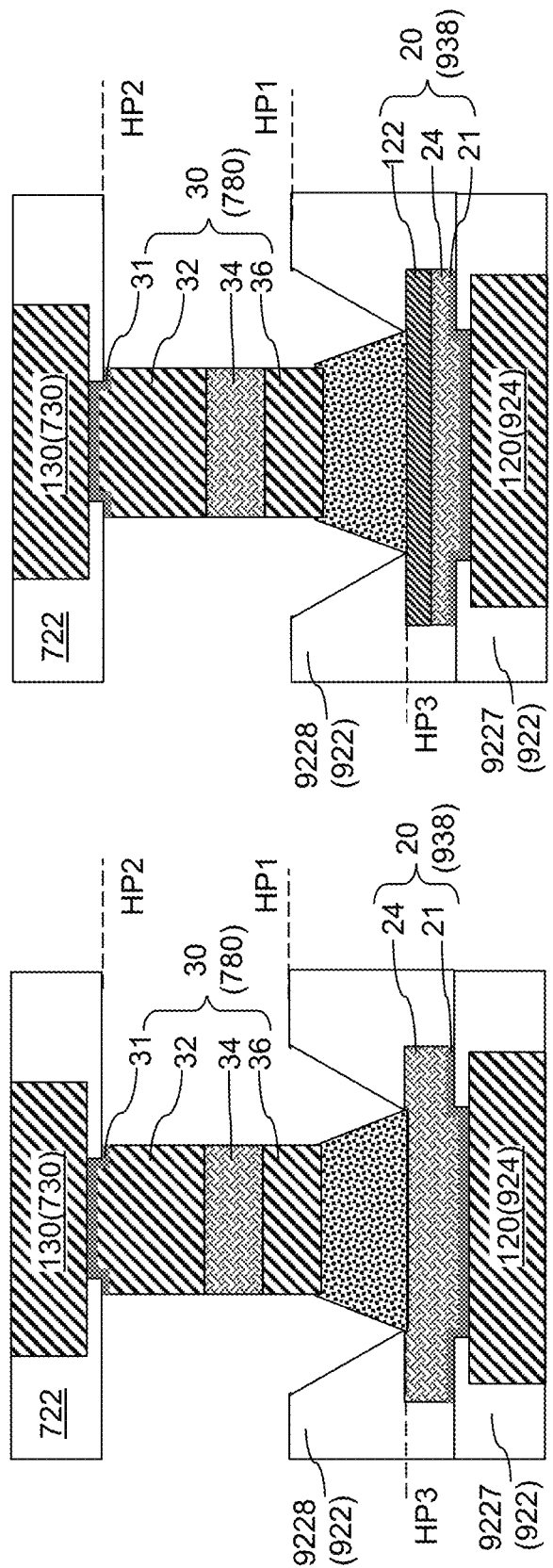

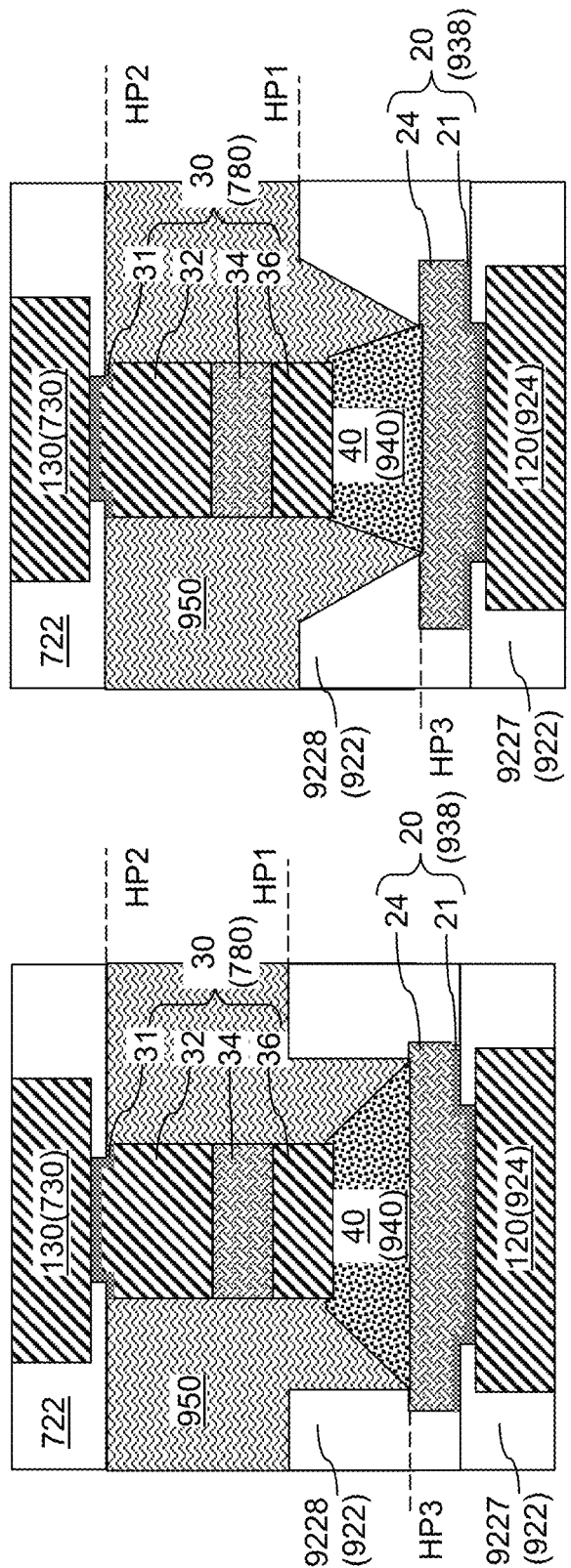

BRIDGING-RESISTANT MICROBUMP STRUCTURES AND METHODS OF FORMING THE SAME

BACKGROUND

Microbump structures may be used to provide electrical connection between a semiconductor die and an interconnection structure such as an interposer. Solder materials used to provide electrical connection between mating pairs of microbump structures are susceptible to bridging, in which neighboring pairs of solder material portions merge due to vibrations during a bonding process. As the solder material portions merge, unintended electrical connections are formed (i.e., electrical short circuits). Such bridging of solder material portions needs to be avoided to increase the bonding yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H illustrate a region of the structure in which a first metallic bump structure is formed as a interposer-side bump structure according to an embodiment of the present disclosure.

FIGS. 4A-4D are vertical cross-sectional views of first alternative configurations for a first metallic bump structure according to an embodiment of the present disclosure.

FIGS. 5A-5E are vertical cross-sectional views of second alternative configurations for a first metallic bump structure according to an embodiment of the present disclosure.

FIG. 6B is a top-down view of the region of the structure of FIG. 6A.

FIGS. 9A-9E are vertical cross-sectional views of second alternative configurations of a region of the structure in which a first metallic bump structure is bonded to a second metallic bump structure according to an embodiment of the present disclosure.

FIGS. 13A-13H are vertical cross-sectional views of a region of various configurations of the structure that includes a bonded pair of a first metallic bump structure and a second metallic bump structure according to an embodiment of the present disclosure.

DETAILED DESCRIPTION

Figure 1A:
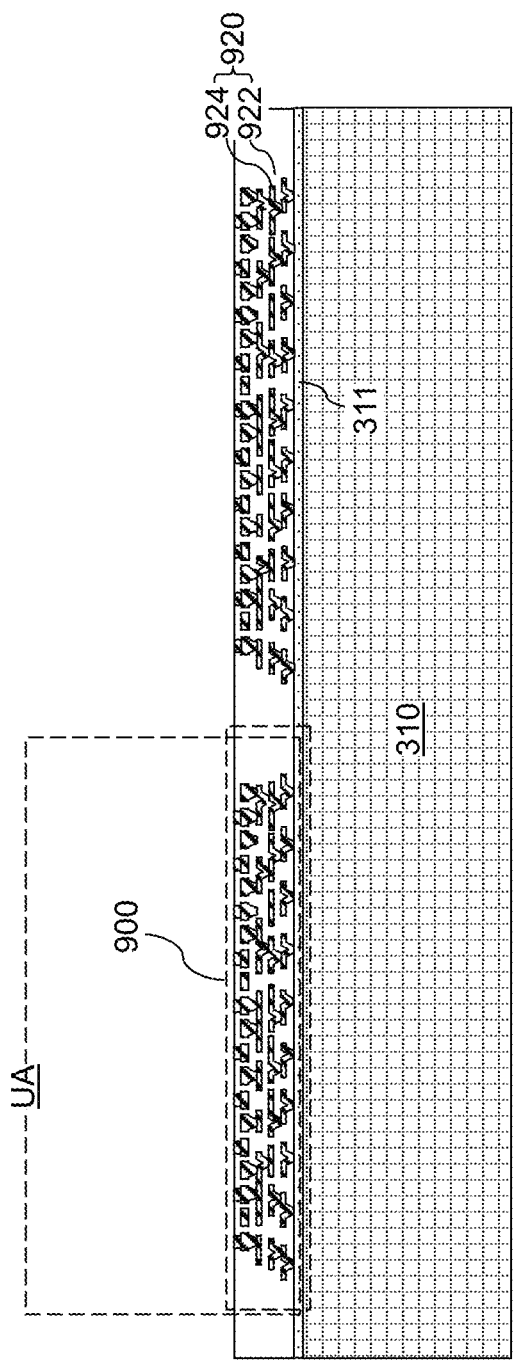
FIG. 1A is a vertical cross-sectional view of a structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to semiconductor devices including bridging-resistant microbump structures. The bridging-resistant microbump structures may comprise embedded pad structures within openings in a dielectric material layer, and may be used for advanced packaging structures using fine pitch interconnects.

A dense fine pitch solder material array is generally prone to a bump shift and bridging problem, in which solder material portions are unintentionally attached to two or more bump pillars due to lateral movements, for example, due to vibrations. The bump shift and bridging problem causes unintended electrical connections between neighboring pairs of bump structures (i.e., electrical short circuit). The bridging-resistant microbump structures of the present disclosure remove, or mitigate against the bump shift bridging problem in fine pitch bump structures. The bridging-resistant microbump structures use a configuration in which a bottom lateral dimension of a bump structure is greater than a top lateral dimension of the bump structure, which may be used to restrict the range of bump shift and to avoid bump bridging. In some embodiment, a nickel-containing portion within a bridging-resistant microbump structure may be used to suppress tin diffusion, and to enhance the reliability of bonding. The bridging-resistant microbump structures of the present disclosure may be used to reduce the pitch of a microbump array, and to provide a high-density solder material array for advanced packaging structures. The bridging-resistant microbump structures of the present disclosure may be used for system-on-chip (SoC) dies and/or other high-density integrated devices, organic interposers, silicon interposers, and/or packaging substrates. The bridging-resistant microbump structures of the present disclosure may use a layer stack including a nickel-containing portion and a high-electrical-conductivity material portion including Cu, Ag, or Au.

Figure 1B:
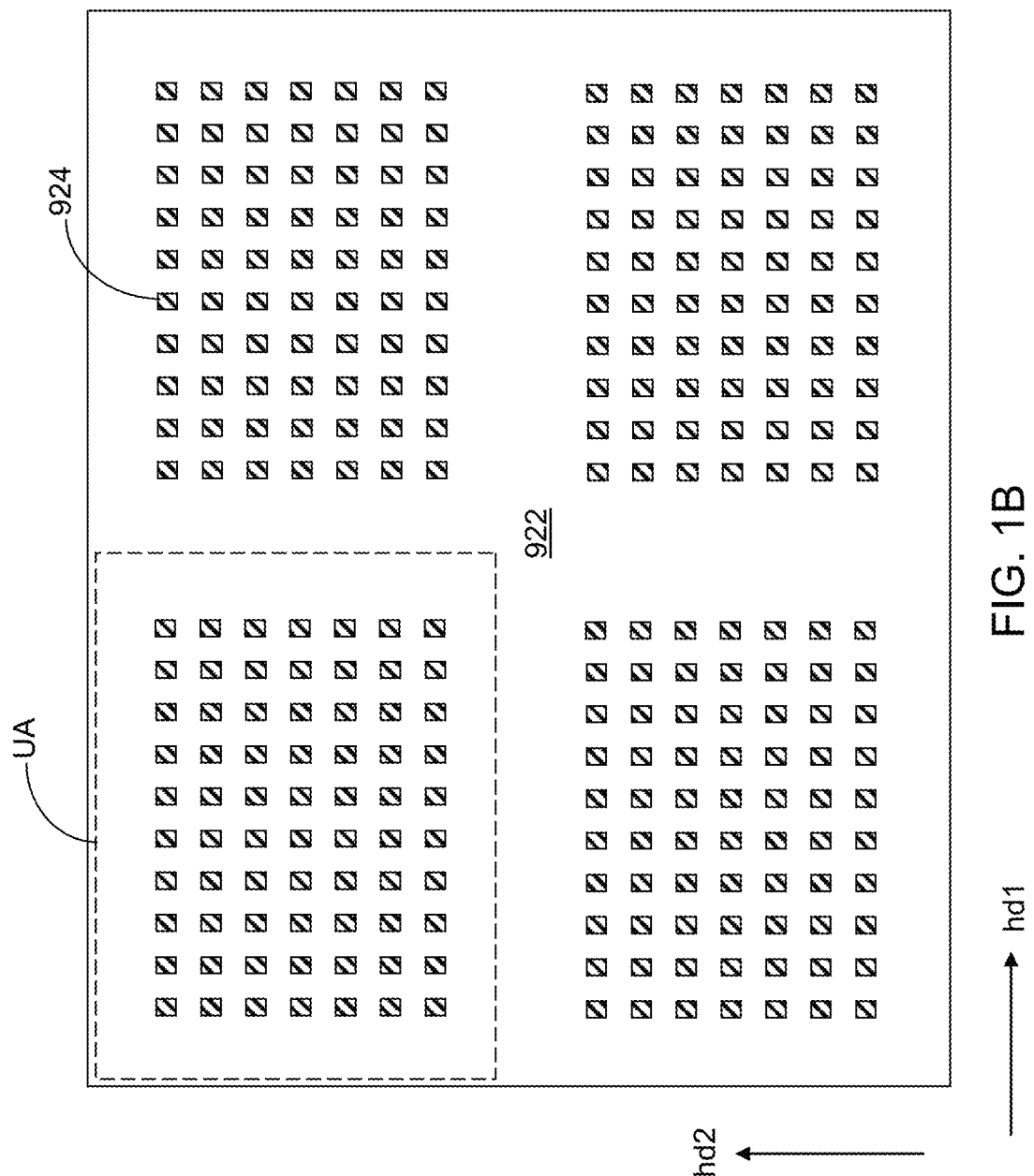
FIG. 1B is a top-down view of the region of the structure of FIG. 1A.

Referring to FIGS. 1A and 1B, an intermediate structure according to an embodiment of the present disclosure may include a first carrier substrate 310 and interposers 900 formed on a front side surface of the first carrier substrate 310. The first carrier substrate 310 may include an optically transparent substrate such as a glass substrate or a sapphire substrate. The diameter of the first carrier substrate 310 may be in a range from 150 mm to 290 mm, although lesser and greater diameters may be used. In addition, the thickness of the first carrier substrate 310 may be in a range from 500 microns to 2,000 microns, although lesser and greater thicknesses may also be used. Alternatively, the first carrier substrate 310 may be provided in a rectangular panel format. The dimensions of the first carrier in such alternative embodiments may be substantially the same.

A first adhesive layer 311 may be applied to the front-side surface of the first carrier substrate 310. In one embodiment, the first adhesive layer 311 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 311 may include a thermally decomposing adhesive material. For example, the first adhesive layer 311 may include an acrylic pressure-sensitive adhesive that decomposes at an elevated temperature. The debonding temperature of the thermally decomposing adhesive material may be in a range from 150 degrees to 200 degrees Celsius.

Interposers 900 may be formed over the first adhesive layer 311. Specifically, an interposer 900 may be formed within each unit area UA, which is the area of a repetition unit that may be repeated in a two-dimensional array over the first carrier substrate 310. Each interposer 900 includes a respective portion of a redistribution structure 920, which is a combination of redistribution dielectric layers 922 and redistribution wiring interconnects 924. The redistribution dielectric layers 922 are dielectric materials embedding the redistribution wiring interconnects 924. The redistribution dielectric layers 922 may be referred to as first dielectric layers or second dielectric layers. The redistribution dielectric layers 922 include a respective dielectric polymer material such as polyimide (PI), benzocyclobutene (BCB), or polybenzobisoxazole (PBO). Other suitable dielectric polymer materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

The redistribution wiring interconnects 924 are metallic connection structures, i.e., metallic structures that provide electrical connection. The redistribution wiring interconnects 924 may be referred to as first metallic connection structures or second metallic connection structures in the claims of the instant application. Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 900 (i.e., the levels of the redistribution wiring interconnects 924) may be in a range from 1 to 10. A periodic two-dimensional array (such as a rectangular array) of interposers 900 may be formed over the first carrier substrate 310. Each interposer 900 may be formed within a unit area UA. The layer including all interposers 900 is herein referred to as an interposer layer. The interposer layer may include a two-dimensional array of interposers 900. In one embodiment, the two-dimensional array of interposers 900 may be a rectangular periodic two-dimensional array of interposers 900 having a first periodicity along a first horizontal direction hd1 and having a second periodicity along a second horizontal direction hd2 that is perpendicular to the first horizontal direction hd1.

Figure 2A:
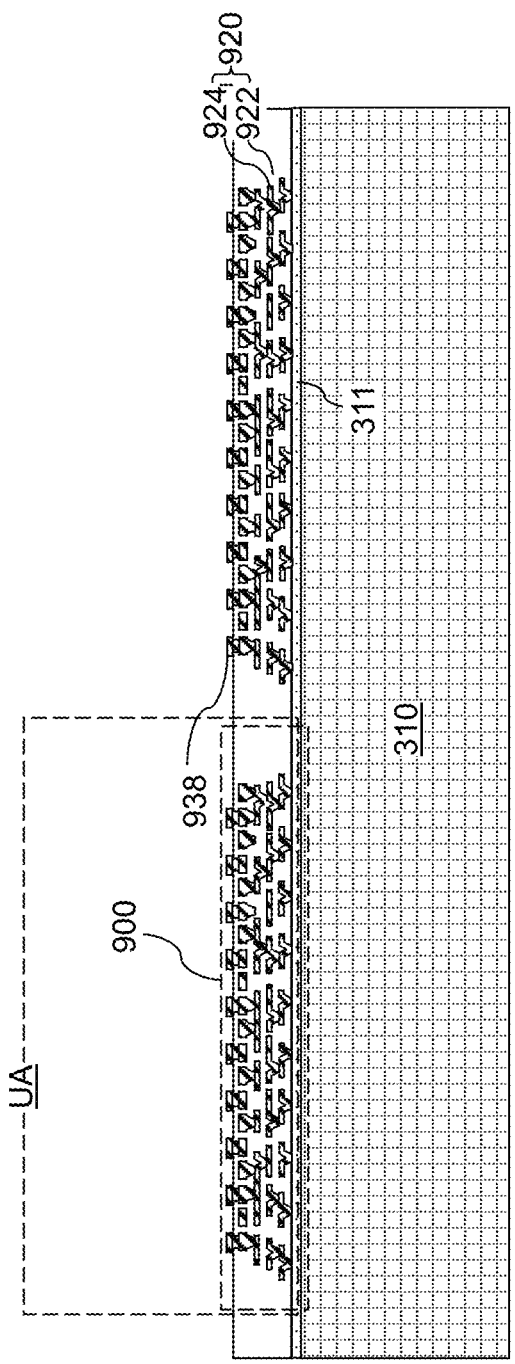
FIG. 2A is vertical cross-sectional view of a region of the structure after formation of interposer-side bump structures according to an embodiment of the present disclosure.
Figure 2B:
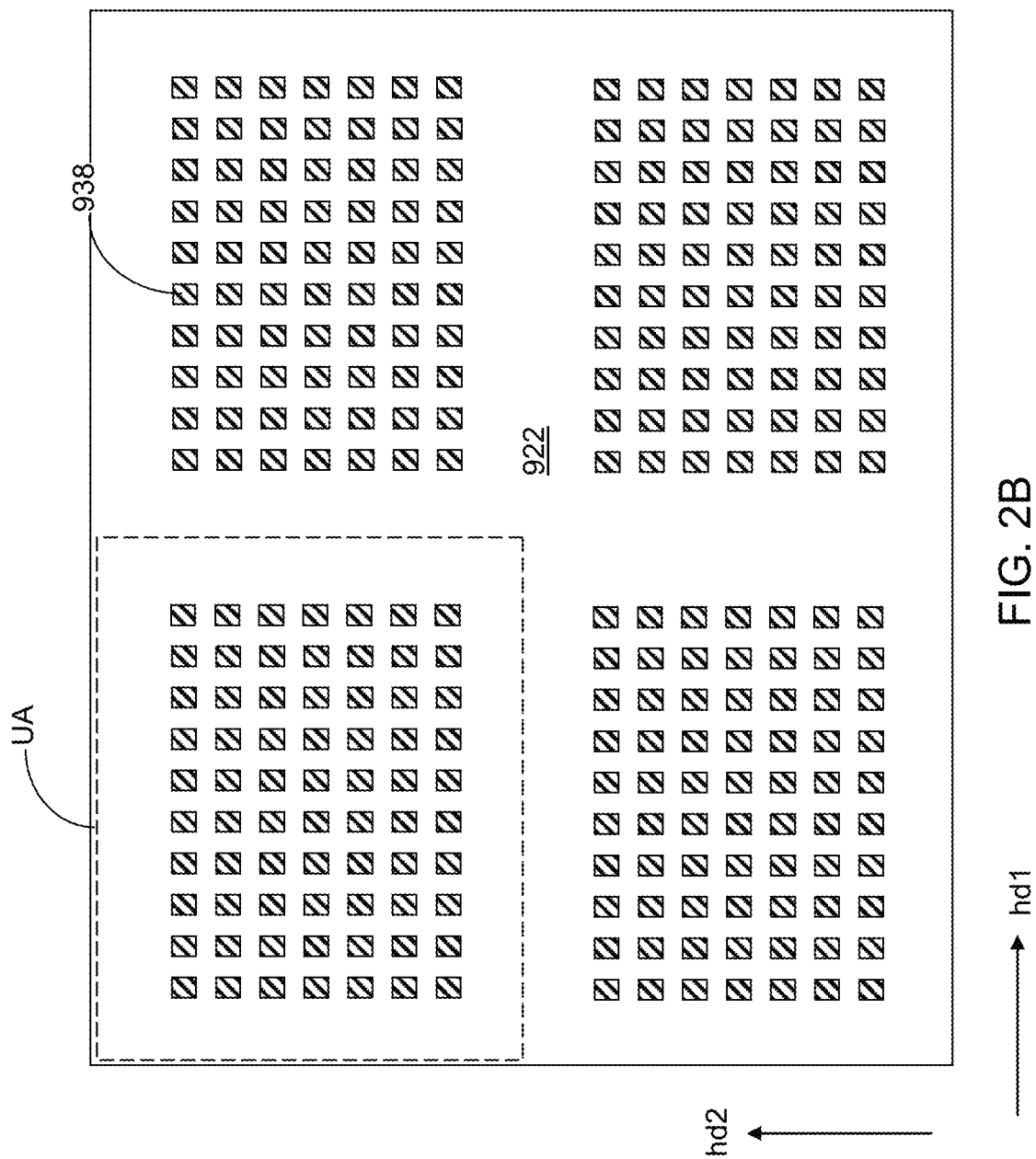
FIG. 2B is a top-down view of the region of the structure of FIG. 2A.

Referring to FIGS. 2A and 2B, at least one array of interposer-side bump structures 938 may be formed on the front surface of each interposer 900, i.e., with a portion of the redistribution structure 920 located within a respective unit area UA. A single array of interposer-side bump structures 938, or a plurality of arrays of interposer-side bump structures 938, may be formed on each interposer 900. In one embodiment, each array of interposer-side bump structures 938 may be formed as a respective periodic array such as a rectangular array.

According to an embodiment of the present disclosure, each interposer 900 may function as a first structure, the redistribution wiring interconnects 924 within each interposer 900 may function as first metallic connection structures, and portions of the redistribution dielectric layer 922 within each interposer 900 may function as first dielectric layers. In this embodiment, the interposer-side bump structures 938 may function as first metallic bump structures. According to an aspect of the present disclosure, the first metallic bump structures may be formed as bridging-resistant bump structures. FIGS. 3A-3H illustrate a region of the structure in which a first metallic bump structure 20 is formed as an interposer-side bump structure 938 according to an embodiment of the present disclosure.

Referring to FIG. 3A, a region of the structure is shown after the processing steps of FIGS. 1A and 1B. A subset of the redistribution wiring interconnects 924 that is located at the topmost level of the redistribution wiring interconnects 924 may be arranged in a configuration of an array of metal pads that are located at positions at which the interposer-side bump structures 938 are to be subsequently formed. The redistribution wiring interconnects 924 function as first metallic connection structures 120. A redistribution dielectric layer 922 laterally surrounding the topmost redistribution wiring interconnects 924 is herein referred to as a topmost interconnect-level redistribution dielectric layer 9227, which is a redistribution dielectric layer that is located at the topmost interconnect level within the redistribution structure 920. The topmost interconnect-level redistribution dielectric layer 9227 may cover peripheral portions of each topmost redistribution wiring interconnect 924. Thus, an opening 19 in the topmost interconnect-level redistribution dielectric layer 9227 may be present over each of the topmost redistribution wiring interconnects 924. The lateral dimensions (such as a diameter of a circular opening or a side of a rectangular opening) may be in a range from 5 microns to 100 microns, such as from 10 microns to 50 microns, although lesser and greater lateral dimensions may also be used.

Referring to FIG. 3B, a first metallic seed layer 21 may be deposited over the physically exposed surfaces of the topmost interconnect-level redistribution dielectric layer 9227 and the topmost redistribution wiring interconnects 924. The first metallic seed layer 21 may include a metallic material that provides subsequent electroplating of another metallic material. The first metallic seed layer 21 may include, for example, titanium, tantalum, tungsten, titanium nitride, tantalum nitride, or tungsten nitride. Other suitable metallic seed layer materials may be within the contemplated scope of disclosure. The first metallic seed layer 21 may be deposited by a first physical vapor deposition process. The thickness of a horizontally-extending portion of the first metallic seed layer 21 may be in a range from 50 nm to 500 nm, although lesser and greater thicknesses may also be used.

Figure 3D:
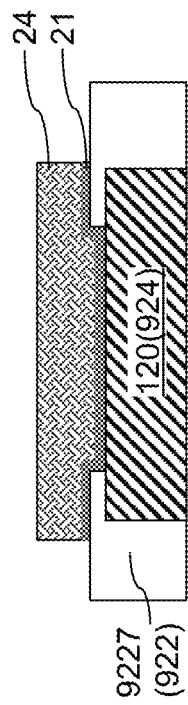
Figure 3C:
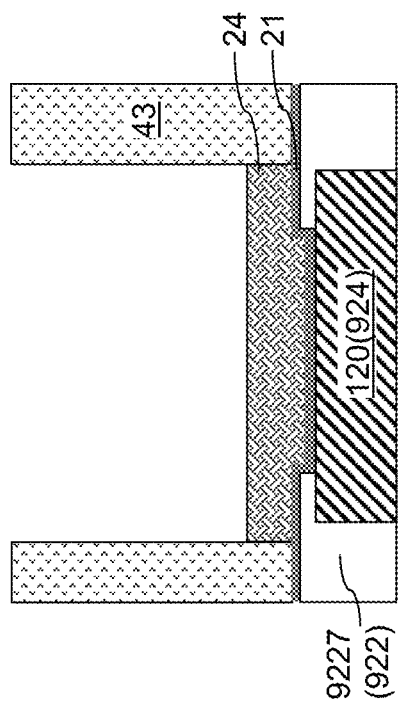

Referring to FIG. 3C, a first photoresist layer 43 may be applied over the first metallic seed layer 21, and may be lithographically patterned to form an array of openings therein. Each opening in the first photoresist layer 43 may be located over a respective one of the topmost redistribution wiring interconnects 924. In one embodiment, the lateral dimension of each opening in the photoresist layer 43 may be greater than the lateral dimension of a respective underlying topmost redistribution wiring interconnect 924 (which is a first metallic connection structure 120). In one embodiment, each opening in the photoresist layer 43 may have a respective periphery that is laterally offset outward from a periphery of an underlying opening 19 in the topmost interconnect-level redistribution dielectric layer 9227 (which is one of first dielectric layers).

A nickel electroplating process may be performed to electroplate nickel on physically exposed surfaces of the first metallic seed layer 21. A nickel plate portion 24 may be formed within each opening in the photoresist layer 43. The thickness of the nickel plate portion 24 may be in a range from 200 nm to 5 microns, such as from 500 nm to 2 microns, although lesser and greater thicknesses may also be used.

Referring to FIG. 3D, the first photoresist layer 43 may be removed, for example, by ashing. An etch process may be performed to remove unmasked portions of the first metallic seed layer 21 (i.e., portions of the first metallic seed layer 21 that are not covered by the nickel plate portions 24). The etch process may comprise an isotropic etch process (such as a wet etch process) or an anisotropic etch process (such as a reactive ion etch process). The first metallic seed layer 21 is divided into a plurality of discrete first metallic seed layers 21 that underlie as respective nickel plate portion 24. Each contiguous combination of a first metallic seed layer 21 and a nickel plate portion 24 forms a base portion of a first metallic bump structure, and is herein referred to as a base bump plate (21, 24). Each base bump plate (21, 24) may be formed on a top surface of a respective one of the first metallic connection structures 120.

Figure 3F:
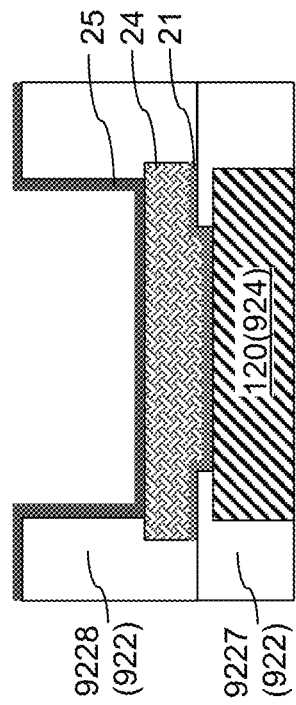
Figure 3E:
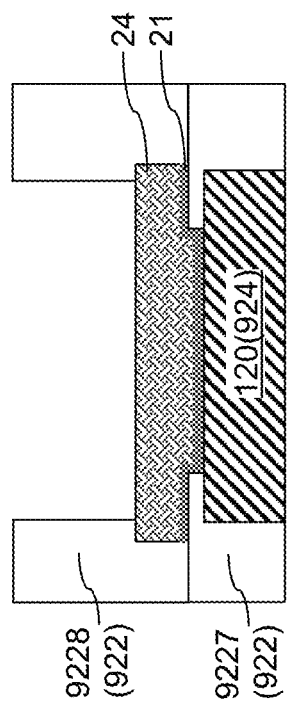

Referring to FIG. 3E, a passivation dielectric layer 9228 may be formed over the nickel plate portions 24. The passivation dielectric layer 9228 is formed at a bump level that overlies interconnect levels of the redistribution structures 922. The passivation dielectric layer 9228 is a topmost one of the redistribution dielectric layers 922, and may be formed directly on the topmost interconnect-level redistribution dielectric layer 9227. The passivation dielectric layer 9228 may include a passivation dielectric material such as polyimide, silicon nitride, silicon carbide nitride, or any other passivation dielectric material known in the art. The thickness of the passivation dielectric layer 9228 may be in a range from 2 microns to 50 microns, such as from 4 microns to 30 microns, although lesser and greater thicknesses may also be used.

The passivation dielectric layer 9228 may be subsequently patterned to form openings over each nickel plate portion 24. For example, a photoresist layer (not shown) may be applied over the passivation dielectric layer 9228, and may be lithographically patterned to form openings over the nickel plate portions 24. In one embodiment, each opening in the photoresist layer may overlie a respective nickel plate portion 24, and may have a periphery that is laterally offset inward from the periphery of the respective nickel plate portion 24 is a plan view (such as a top-down view). An etch process (such as an anisotropic etch process) may be performed to etch portions of the passivation dielectric layer 9228 that are not masked by the photoresist layer. A top surface of the underlying nickel plate portion 24 may be physically exposed at the bottom of each opening through the passivation dielectric layer 9228. The photoresist layer may be subsequently removed, for example, by ashing. In an alternative embodiment, the passivation dielectric layer 9228 may comprise a photosensitive passivation dielectric material such as photosensitive polyimide. In this embodiment, the passivation dielectric layer 9228 may be patterned by direct lithographic exposure and development.

Referring to FIG. 3F, a second metallic seed layer 25 may be deposited over the physically exposed surfaces of the passivation dielectric layer 9228 and the base bump plates (21, 24). The second metallic seed layer 25 includes a metallic material that provides subsequent electroplating of another metallic material. The second metallic seed layer 25 may include, for example, titanium, tantalum, tungsten, titanium nitride, tantalum nitride, or tungsten nitride. Other suitable metallic seed layer materials may be within the contemplated scope of disclosure. The second metallic seed layer 25 may be deposited by a second physical vapor deposition process. The thickness of a horizontally-extending portion of the second metallic seed layer 25 may be in a range from 50 nm to 500 nm, although lesser and greater thicknesses may also be used.

Referring to FIG. 3G, a second photoresist layer 47 may be applied over the second metallic seed layer 25, and may be lithographically patterned to form an array of openings therein. Each opening in the second photoresist layer 47 may be located over a respective one of the base bump plates (21, 24). In one embodiment, the lateral dimension of each opening in the photoresist layer 47 may be greater than the lateral dimension of a respective underlying opening in the passivation dielectric layer 9228, and may be laterally offset outward from a periphery of the respective underlying opening in the passivation dielectric layer 9228.

A copper electroplating process may be performed to electroplate copper on physically exposed surfaces of the second metallic seed layer 25. A copper plate portion 26 may be formed within each opening in the photoresist layer 47. The thickness of the copper plate portion 26 may be in a range from 500 nm to 20 microns, such as from 1 micron to 10 microns, and/or from 1.5 microns to 5 microns, although lesser and greater thicknesses may also be used. Generally, the thickness of the copper plate portion 26 may be selected such that the lateral dimension of an unfilled cavity (such as a diameter of a circular cylindrical unfilled cavity or a side of a rectangular cylindrical unfilled cavity) is greater than a maximum lateral dimension of a second metallic bump structure to be provided on a semiconductor die that is to be attached to an interposer 900. For example, the lateral dimension of an unfilled cavity that is laterally surrounded by a copper plate portion 26 may be in a range from 5 microns to 80 microns, such as from 10 microns to 40 microns, although lesser and greater lateral dimensions for the unfilled cavities may also be used.

Referring to FIG. 3H, the second photoresist layer 47 may be removed, for example, by ashing. An etch process may be performed to remove unmasked portions of the second metallic seed layer 25 (i.e., portions of the second metallic seed layer 25 that are not covered by the copper plate portions 26). The etch process may comprise an isotropic etch process (such as a wet etch process) or an anisotropic etch process (such as a reactive ion etch process). The second metallic seed layer 25 is divided into a plurality of discrete second metallic seed layers 25 that underlie as respective copper plate portion 26. Each contiguous combination of a second metallic seed layer 25 and a copper plate portion 26 forms a contoured portion of a second metallic bump structure, and is herein referred to as a contoured bump plate (25, 26). Each contoured bump plate (25, 26) may be formed on a top surface of a respective one of the base bump plates (21, 24). Each contiguous combination of a base bump plate (21, 24) and a contoured bump plate (25, 26) constitutes a first metallic bump structure 20, which may be an interposer-side bump structure 928 shown in FIGS. 2A and 2B.

Generally speaking, a first structure (such as an interposer 900) including first metallic connection structures 120 (such as redistribution wiring interconnects 924) surrounded by first dielectric layers (such as redistribution dielectric layers 922) may be provided. Base bump plates (21, 24) may be formed on a top surface of a respective one of the first metallic connection structures 120. A passivation dielectric layer 9228 including an array of openings therein may be formed over the base bump plates (21, 24). The passivation dielectric layer 9228 may be incorporated into the first dielectric layers as a topmost first dielectric layer. Top surfaces of the base bump plates (21, 24) are physically exposed within the array of openings in the passivation dielectric layer 9228. Contoured bump plates (25, 26) may be formed on the base bump plates (21, 24) within, and over, the openings in the passivation dielectric layer 9228. Each of the contoured bump plates (25, 26) comprises a horizontally-extending bottom portion that is formed on a respective one of the base bump plates (21, 24), and a tapered or vertically-extending portion contacting a tapered or vertical sidewall of a respective opening selected from the array of openings in the passivation dielectric layer 9228, and an annular horizontal portion having an inner periphery that is adjoined to a top periphery of an outer sidewall of the tapered or vertically-extending portion and overlying a top surface of the passivation dielectric layer 9228.

An array of first metallic bump structures 20 may be formed on each interposer 900. Each first metallic bump structure 20 within the array of first metallic bump structures 20 comprises a respective one of the base bump plates (21, 24) and comprises a respective first horizontal bonding surface segment that is vertically recessed from a first horizontal plane HP1 including a distal horizontal surface of the passivation dielectric layer 9228 and located within a respective opening selected from the array of openings in the passivation dielectric layer 9228. In one embodiment, the first horizontal bonding surface segments comprise horizontal surface segments of the horizontally-extending bottom portions of the contoured bump plates (25, 26).

Generally, the first metallic bump structures 20 may be formed in various configurations. FIGS. 4A-4D are vertical cross-sectional views of first alternative configurations for a first metallic bump structure 20 according to an embodiment of the present disclosure.

Referring to FIG. 4A, an alternative configuration of the first metallic bump structure 20 may be derived from the first metallic bump structure 20 illustrated in FIG. 3H by electroplating a stack of a first copper plate portion 22 and a nickel plate portion 24 in lieu of a nickel plate portion 24 at a processing step that corresponds to the processing step of FIG. 3C. The thickness of the first copper plate portion 22 may be in a range from 200 nm to 3 microns, such as from 500 nm to 1 micron, although lesser and greater thicknesses may also be used. The thickness of the nickel plate portion 24 in FIG. 4A may be in a range from 200 nm to 3 microns, such as from 500 nm to 1 micron, although lesser and greater thicknesses may also be used. Each base bump plates (21, 22, 24) comprises a first metallic seed layer 21, a first copper plate portion 22, and a nickel plate portion 24.

Further, an electrically-conductive-material plate portion 126 may be formed in lieu of a copper plate portion 26 at a processing step that corresponds to the processing step of FIG. 3G. The electrically-conductive-material plate portion 126 may comprise a highly electrically conductive material such as gold, silver, or copper. The thickness of the electrically-conductive-material plate portion 126 may be in a range from 500 nm to 20 microns, such as from 1 micron to 10 microns, and/or from 1.5 microns to 5 microns, although lesser and greater thicknesses may also be used. Generally, the thickness of the electrically-conductive-material plate portion 126 may be selected such that the lateral dimension of an unfilled cavity (such as a diameter of a circular cylindrical unfilled cavity or a side of a rectangular cylindrical unfilled cavity) is greater than a maximum lateral dimension of a second metallic bump structure to be provided on a semiconductor die that is to be attached to an interposer 900. For example, the lateral dimension of an unfilled cavity that is laterally surrounded by a tapered or vertically-extending portion of the electrically-conductive-material plate portion 126 may be in a range from 5 microns to 80 microns, such as from 10 microns to 40 microns, although lesser and greater lateral dimensions for the unfilled cavities may also be used. Each contoured bump plate (25, 126) comprises a combination of a second metallic seed layer 25 and an electrically-conductive-material plate portion 126.

Referring to FIG. 4B, an alternative configuration of the first metallic bump structure 20 may be derived from the first metallic bump structure 20 illustrated in FIG. 4A by electroplating a stack of a nickel plate portion 24 and an electrically-conductive-material plate portion 122 and in lieu of a nickel plate portion 24 at a processing step that corresponds to the processing step of FIG. 3C. The thickness of the nickel plate portion 24 in FIG. 4A may be in a range from 200 nm to 3 microns, such as from 500 nm to 1 micron, although lesser and greater thicknesses may also be used. The thickness of the electrically-conductive-material plate portion 122 may be in a range from 200 nm to 3 microns, such as from 500 nm to 1 micron, although lesser and greater thicknesses may also be used. Each base bump plates (21, 24, 122) comprises a first metallic seed layer 21, a nickel plate portion 24, and an electrically-conductive-material plate portion 122.

Referring to FIG. 4C, an alternative configuration of the first metallic bump structure 20 may be the same as the base bump plate (21, 24) illustrated in FIG. 3E. In this embodiment, the first metallic bump structure 20 may consist of a base bump structure (21, 24). Each first metallic bump structure 20 within the array of first metallic bump structures 20 consists of a respective one of the base bump plates (21, 24), and comprises a respective first horizontal bonding surface segment that is vertically recessed from a first horizontal plane HP1 including a distal horizontal surface of the passivation dielectric layer 9228 and located within a respective opening selected from the array of openings in the passivation dielectric layer 9228. In one embodiment, the first horizontal bonding surface segments comprise horizontal surface segments of the top surface of the base bump plate (21, 24). In one embodiment, the lateral dimension of an opening in the passivation dielectric layer 9228 may be in a range from 5 microns to 80 microns, such as from 10 microns to 40 microns, although lesser and greater lateral dimensions for the openings may also be used.

Referring to FIG. 4D, an alternative configuration of the first metallic bump structure 20 may be derived from the first metallic bump structure 20 illustrated in FIG. 4B by omitting formation of a contoured bump plate (25, 126). Each first metallic bump structure 20 within the array of first metallic bump structures 20 consists of a respective one of the base bump plates (21, 24, 122), and comprises a respective first horizontal bonding surface segment that is vertically recessed from a first horizontal plane HP1 including a distal horizontal surface of the passivation dielectric layer 9228 and located within a respective opening selected from the array of openings in the passivation dielectric layer 9228. In one embodiment, the first horizontal bonding surface segments comprise horizontal surface segments of the top surface of the base bump plate (21, 24, 122). In one embodiment, the lateral dimension of an opening in the passivation dielectric layer 9228 may be in a range from 5 microns to 80 microns, such as from 10 microns to 40 microns, although lesser and greater lateral dimensions for the openings may also be used.

FIGS. 5A-5E are vertical cross-sectional views of second alternative configurations for a first metallic bump structure 20 according to an embodiment of the present disclosure.

Figure 5A:
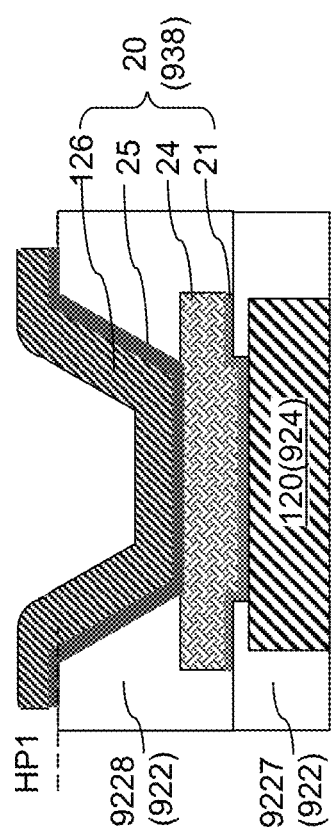

Referring to FIG. 5A, an alternative configuration for a first metallic bump structure 20 may be derived from the first metallic bump structure 20 illustrated in FIG. 3H by forming tapered openings through the passivation dielectric layer 9228 in lieu of openings having vertical sidewalls. The taper angle of the tapered openings, as measured between a vertical direction and a tapered surface of the tapered openings, may be in a range from 0.1 degree to 45 degrees, such as from 1 degree to 30 degrees and/or from 5 degrees to 20 degrees, although lesser and greater taper angles may also be used.

Referring to FIG. 5B, an alternative configuration for a first metallic bump structure 20 may be derived from the first metallic bump structure 20 illustrated in FIG. 4A by forming tapered openings through the passivation dielectric layer 9228 in lieu of openings having vertical sidewalls in the same manner as described with reference to FIG. 5A.

Referring to FIG. 5C, an alternative configuration for a first metallic bump structure 20 may be derived from the first metallic bump structure 20 illustrated in FIG. 4B by forming tapered openings through the passivation dielectric layer 9228 in lieu of openings having vertical sidewalls in the same manner as described with reference to FIG. 5A.

Referring to FIG. 5D, an alternative configuration for a first metallic bump structure 20 may be derived from the first metallic bump structure 20 illustrated in FIG. 4C by forming tapered openings through the passivation dielectric layer 9228 in lieu of openings having vertical sidewalls in the same manner as described with reference to FIG. 5A.

Referring to FIG. 5E, an alternative configuration for a first metallic bump structure 20 may be derived from the first metallic bump structure 20 illustrated in FIG. 4D by forming tapered openings through the passivation dielectric layer 9228 in lieu of openings having vertical sidewalls in the same manner as described with reference to FIG. 5A.

Figure 6A:
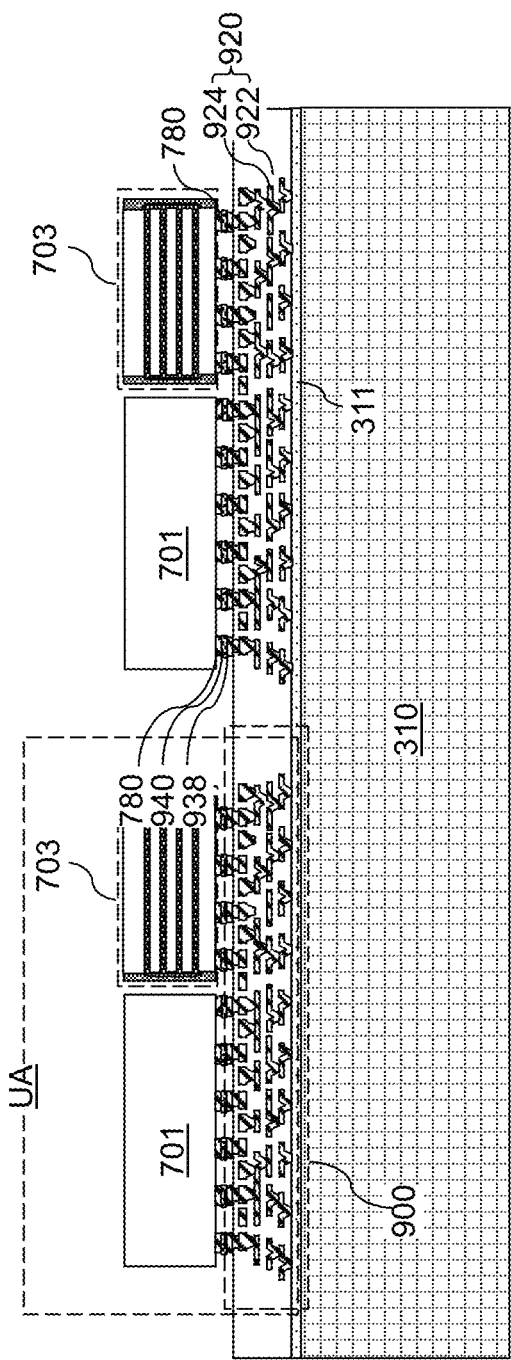
FIG. 6A is a vertical cross-sectional view of a region the structure after attaching semiconductor dies according to an embodiment of the present disclosure.

Referring to FIGS. 6A and 6B, a set of at least one semiconductor die (701, 703) may be bonded to each redistribution structure 920. In one embodiment, the redistribution structures 920 may be arranged as a two-dimensional periodic array, and multiple sets of at least one semiconductor die (701, 703) may be bonded to the redistribution structures 920 as a two-dimensional periodic rectangular array of sets of the at least one semiconductor die (701, 703). Each set of at least one semiconductor die (701, 703) includes at least one semiconductor die. Each set of at least one semiconductor die (701, 703) may include any set of at least one semiconductor die known in the art. In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Each semiconductor die (701, 703) may comprise a respective array of die-side bump structures 780. Each of the semiconductor dies (701, 703) may be positioned in a face-down position such that die-side bump structures 780 face the first solder material portions 940. Each set of at least one semiconductor die (701, 703) may be placed within a respective unit area UA. Placement of the semiconductor dies (701, 703) may be performed using a pick and place apparatus such that each of the die-side bump structures 780 may be placed on a top surface of a respective one of the first solder material portions 940.

Generally, a redistribution structure 920 including interposer-side bump structures 938 thereupon may be provided, and at least one semiconductor die (701, 703) including a respective set of die-side bump structures 780 may be provided. The at least one semiconductor die (701, 703) may be bonded to the redistribution structure 920 using first solder material portions 940 that are bonded to a respective interposer-side bump structure 938 and to a respective one of the die-side bump structures 780.

Each set of at least one semiconductor die (701, 703) may be attached to a respective redistribution structure 920 through a respective set of first solder material portions 940. Each of the at least one cushioning film within a unit area UA may be located outside an area including the at least one semiconductor die (701, 703) in the unit area UA in a plan view. The plan view is a view along a vertical direction, which is the direction that is perpendicular to the planar top surface of the redistribution structure layer.

Figure 6C:
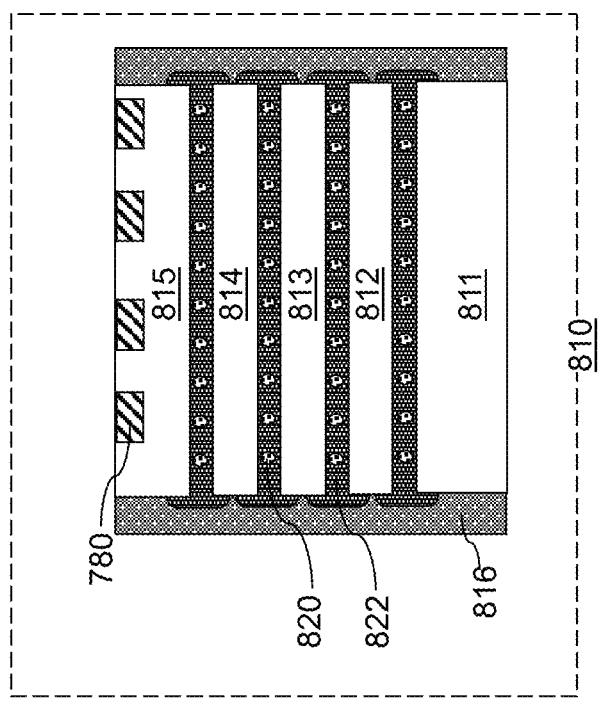
FIG. 6C is a magnified vertical cross-sectional view of a high bandwidth memory die.

Referring to FIG. 6C, a high bandwidth memory (HBM) die 810 is illustrated, which may be used as a memory die 703 within the structures of FIGS. 6A and 6B. The HBM die 810 may include a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of die-side bump structures 780 configured to be bonded to a subset of an array of interposer-side bump structures 938 within a unit area UA. The HBM die 810 may, or may not, be configured to provide a high bandwidth as defined under JEDEC standards, i.e., standards defined by The JEDEC Solid State Technology Association.

Figures 7A, 7B:
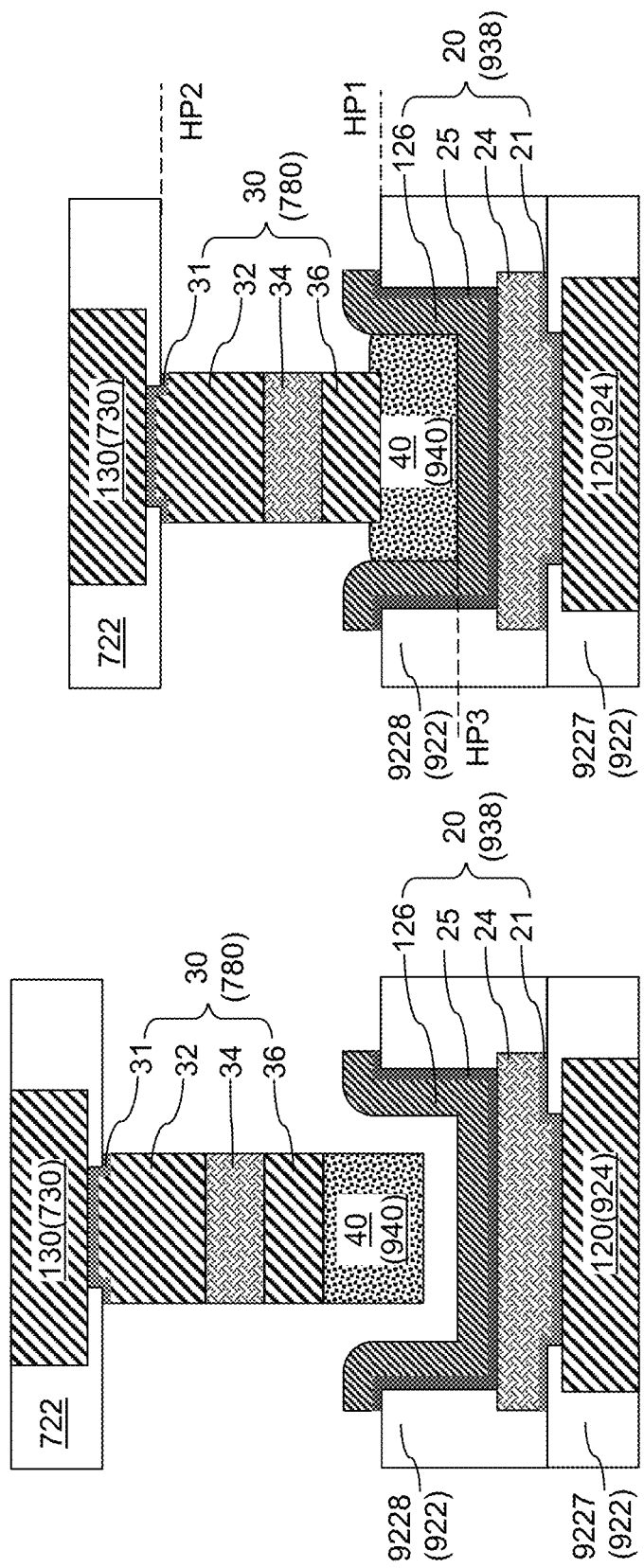
FIGS. 7A and 7B are sequential vertical cross-sectional views of a region of the structure in which a first metallic bump structure is bonded to a second metallic bump structure according to an embodiment of the present disclosure.

FIGS. 7A and 7B are sequential vertical cross-sectional views of a region of the structure of FIGS. 6A and 6B in which a first metallic bump structure 20 (comprising an interposer-side bump structure 938) is bonded to a second metallic bump structure 30 (comprising a die-side bump structure 780) according to an embodiment of the present disclosure.

Referring to FIG. 7A, a region of the structure of FIGS. 6A and 6B is shown prior to bonding a semiconductor die (701 or 703) to an interposer 900. The semiconductor die (701, 703) functions as a second structure including second connection structures 130 surrounded by second dielectric layers 722. The second connection structures 130 may be metal interconnect structures 730 of the semiconductor die (701 or 703). The second dielectric layers 722 may comprise the dielectric material layers of the semiconductor die (701 or 703) that embeds the metal interconnect structures 730. A most distal dielectric layer selected from the second dielectric layers 722 may be a passivation dielectric layers.

The second metallic bump structure 30 (comprising the die-side bump structures 780) may be formed by physically exposing top surfaces of a topmost subset of the second connection structures 130 (for example, by forming openings through a topmost layer selected from the second dielectric layers 722), by depositing a metallic seed layer 31, by forming a patterned photoresist layer having openings in areas of the topmost subset of the second connection structures 130, and by sequentially electroplating metallic material portions (32, 34, 36) in each opening in the photoresist layer. In an illustrative example, each contiguous set of the metallic material portions (32, 34, 36) that is formed within a respective opening in the photoresist layer may comprise a first copper plate portion 32, a nickel plate portion 34, and a second copper plate portion 36. The photoresist layer may be subsequently removed, for example, by ashing. Unmasked portions of the metallic seed layer 31 may be etched by performing an anisotropic etch process or an isotropic etch process. Each patterned portion of the metallic seed layer 31 may be located underneath a respective contiguous set of metallic material portions (32, 34, 36). Each contiguous set of a metallic seed layer 31 and metallic material portions (32, 34, 36) constitutes a second metallic bump structure 30. In the illustrative example, a second metallic bump structure 30 may comprise a vertical stack of a metallic seed layer 31, a first copper plate portion 32, a nickel plate portion 34, and a second copper plate portion 36.

In an illustrative example, the metallic seed layer 31 may have a thickness in a range from 50 nm to 500 nm, although lesser and greater thicknesses may also be used. The first copper plate portion 32 may have a thickness in a range from 500 nm to microns, although lesser and greater thicknesses may also be used. The nickel plate portion 34 may have a thickness in a range from 500 nm to 20 microns, although lesser and greater thicknesses may also be used. The second copper plate portion 32 may have a thickness in a range from 500 nm to 80 microns, although lesser and greater thicknesses may also be used. The total height of each second metallic bump structure may be in a range from 10 microns to 100 microns, although lesser and greater heights may also be used. Each second metallic bump structure 30 may have a pillar configuration such that the first copper plate portion 32, the nickel plate portion 34, and the second copper plate portion 36 have a same horizontal cross-sectional shape. The same horizontal cross-sectional shape may be a circle, a square, a rounded square, or any two-dimensional curvilinear shape having a closed periphery. The lateral dimension of each second metallic bump structure 30 (such as a diameter or a lateral distance between parallel pairs of surface segments) is less than the lateral dimension of a cavity overlying a first horizontal bonding surface segment of a first metallic bump structure 20 described above. In an illustrative example, the lateral dimension of each second metallic bump structure 30 (such as a diameter or a lateral distance between parallel pairs of surface segments) may be in a range from 2 microns to 50 microns, such as from 6 microns to 30 microns, although lesser and greater lateral dimensions for the lateral dimension may also be used.

A solder material portion 40 (such as a first solder material portion 940 described above) may be applied to the second metallic bump structure 30.

Referring to FIG. 7B, a region of the structure of FIGS. 6A and 6B is shown after bonding the semiconductor die (701 or 703) to the interposer 900. In this embodiment, the solder material portion 40 may be bonded to the first horizontal bonding surface segment of the first metallic bump structure 20. In one embodiment, the solder material portion 40 may be positioned entirely within a cavity in the passivation dielectric layer 9228.

In one embodiment, upon the array of first metallic bump structures 20 to the array of second metallic bump structures 30, a horizontal dielectric surface of a first structure (such as an interposer 900) that is most proximal to the second structure (such as a semiconductor die (701, 703)) may be located within a first horizontal plane HP1, and a horizontal dielectric surface of the second structure (such as the semiconductor die (701, 703)) that is most proximal to the first structure (such as the interposer 900) is located within a second horizontal plane HP2. In one embodiment, the array of solder material portions 40 contact the first horizontal bonding surface segments of the first metallic bump structure 20 within a third horizontal plane HP3, and an entirety of the array of solder material portions 40 may be formed between the first horizontal plane HP1 and the third horizontal plane HP3.

Generally, any of the configurations for the first metallic bump structure 20 may be used to provide bonding between a first structure (such as an interposer 900) and a second structure (such as a semiconductor die (701, 703)).

FIGS. 8A-8D are vertical cross-sectional views of first alternative configurations of a region of the structure in which a first metallic bump structure 20 is bonded to a second metallic bump structure 30 according to an embodiment of the present disclosure.

Figures 8A, 8B:
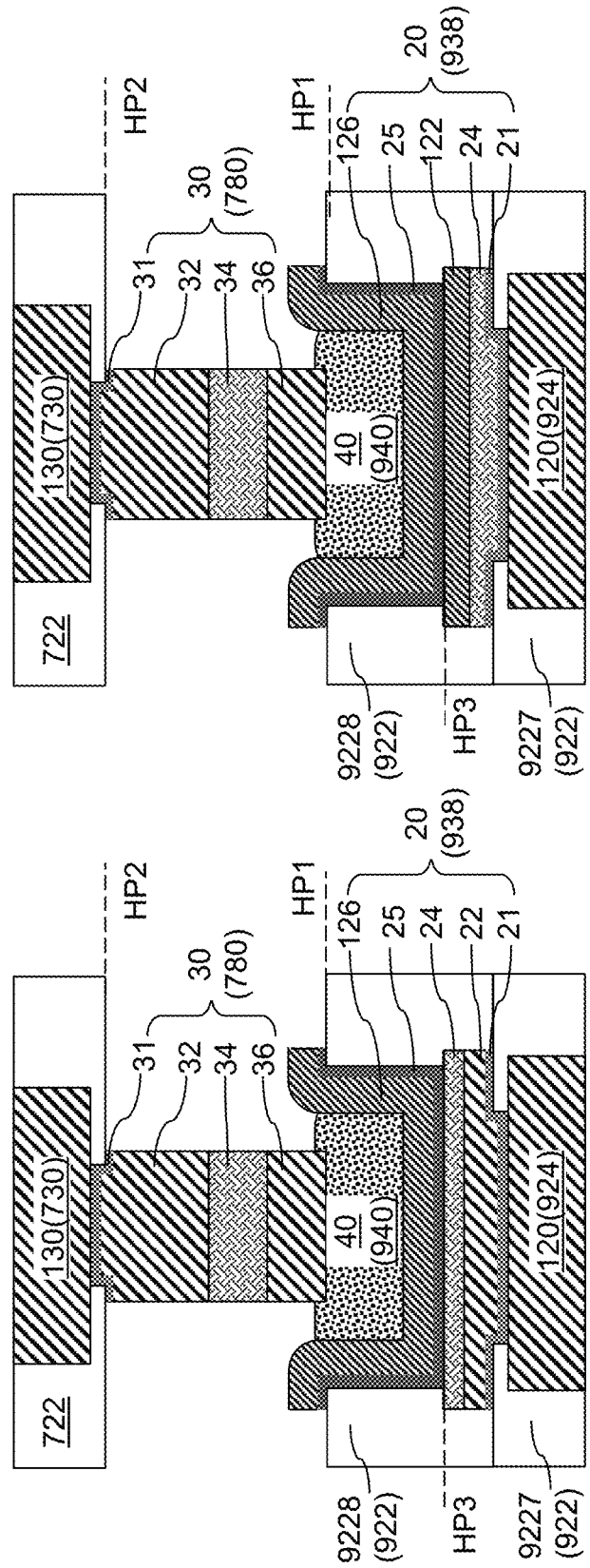
FIGS. 8A-8D are vertical cross-sectional views of first alternative configurations of a region of the structure in which a first metallic bump structure is bonded to a second metallic bump structure according to an embodiment of the present disclosure.

Referring to FIG. 8A, an alternative configuration of a bonding structure is illustrated, which uses a configuration of the first metallic bump structure 20 illustrated in FIG. 4A and a second metallic bump structure 30 to provide the bonding structure.

Referring to FIG. 8B, an alternative configuration of a bonding structure is illustrated, which uses a configuration of the first metallic bump structure 20 illustrated in FIG. 4B and a second metallic bump structure 30 to provide the bonding structure.

Figures 8C, 8D:
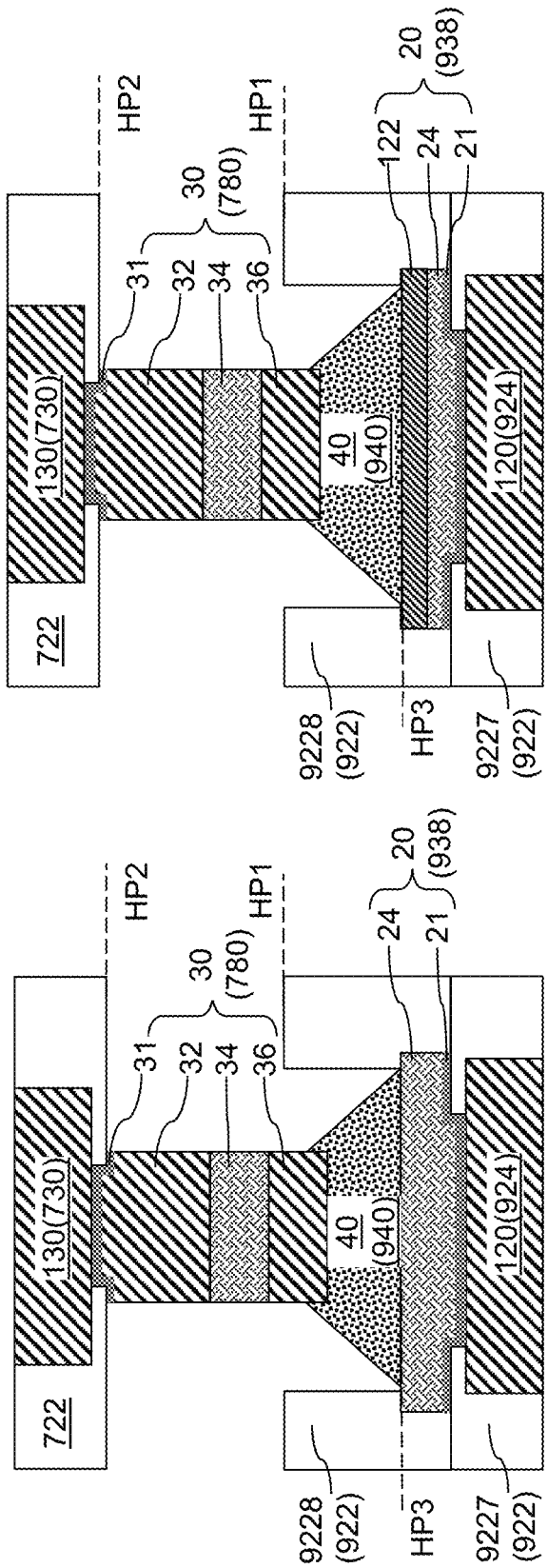

Referring to FIG. 8C, an alternative configuration of a bonding structure is illustrated, which uses a configuration of the first metallic bump structure 20 illustrated in FIG. 4C and a second metallic bump structure 30 to provide the bonding structure.

Referring to FIG. 8D, an alternative configuration of a bonding structure is illustrated, which uses a configuration of the first metallic bump structure 20 illustrated in FIG. 4D and a second metallic bump structure 30 to provide the bonding structure.

FIGS. 9A-9E are vertical cross-sectional views of second alternative configurations of a region of the structure in which a first metallic bump structure 20 is bonded to a second metallic bump structure 30 according to an embodiment of the present disclosure.

Figure 9A:
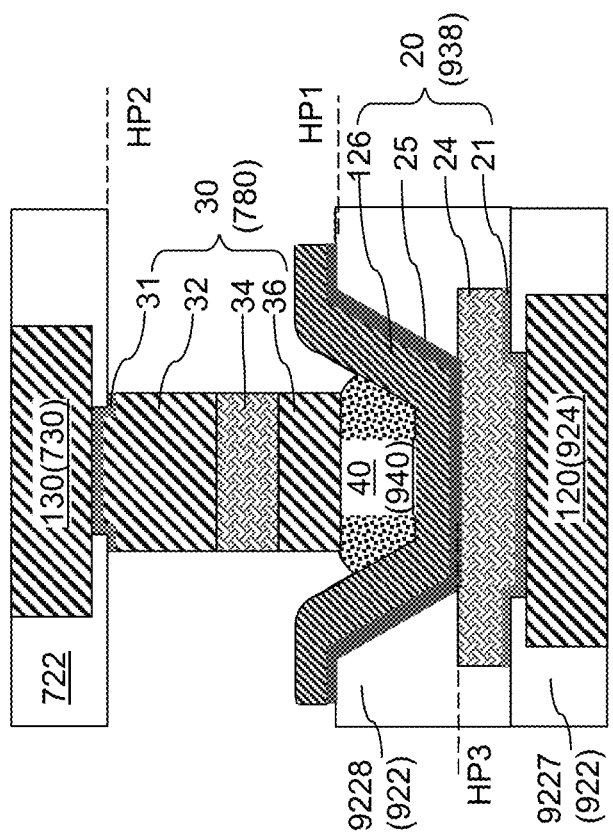

Referring to FIG. 9A, an alternative configuration of a bonding structure is illustrated, which uses a configuration of the first metallic bump structure 20 illustrated in FIG. 5A and a second metallic bump structure 30 to provide the bonding structure.

Figures 9B, 9C:
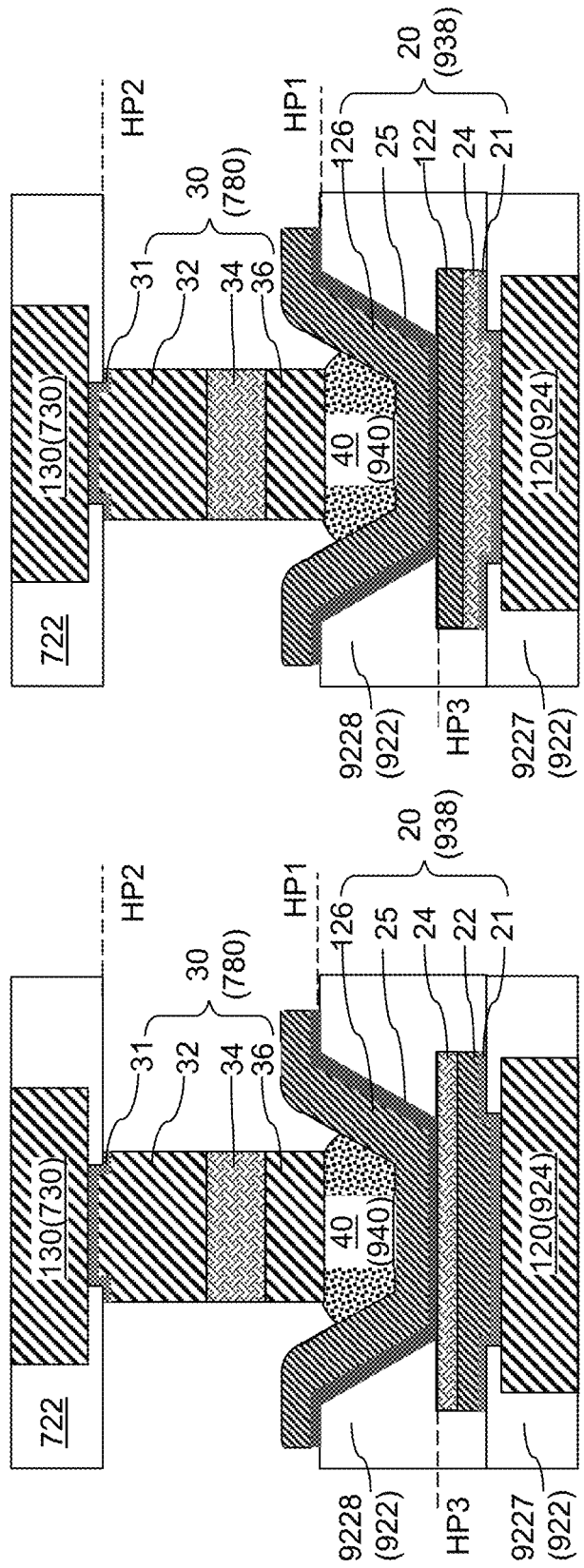

Referring to FIG. 9B, an alternative configuration of a bonding structure is illustrated, which uses a configuration of the first metallic bump structure 20 illustrated in FIG. 5B and a second metallic bump structure 30 to provide the bonding structure.

Referring to FIG. 9C, an alternative configuration of a bonding structure is illustrated, which uses a configuration of the first metallic bump structure 20 illustrated in FIG. 5C and a second metallic bump structure 30 to provide the bonding structure.

Referring to FIG. 9D, an alternative configuration of a bonding structure is illustrated, which uses a configuration of the first metallic bump structure 20 illustrated in FIG. 5D and a second metallic bump structure 30 to provide the bonding structure.

Referring to FIG. 9E, an alternative configuration of a bonding structure is illustrated, which uses a configuration of the first metallic bump structure 20 illustrated in FIG. 5E and a second metallic bump structure 30 to provide the bonding structure.

While the present disclosure has been described using embodiments in which the first structure on which the first metallic bump structures 20 are formed is an interposer 900 and the second structure on which the second metallic bump structures are formed is a semiconductor die (701, 703), embodiments of the present disclosure may be practiced such that the first structure on which the first metallic bump structures are formed is a semiconductor die (701, 703) and the second structure on which the second metallic bump structures 30 are formed is an interposer 900. In other words, the first metallic bump structures 20 may comprise die-side bump structures 780, and the second metallic bump structures 30 may comprise interposer-side bump structures 938. In this embodiment, the first connection structures 120 may be metal interconnect structures 730 within a semiconductor die (701, 703), and the first dielectric layers of the first structure may be the dielectric material layers of the semiconductor die (701, 703) that embeds the metal interconnect structures 730. The second connection structures 130 may be the redistribution metal interconnects 924 within the interposer 900, and the second dielectric layers of the second structure may be the redistribution dielectric layers 922 of the interposer 900.

FIGS. 10A-10E are vertical cross-sectional views of third alternative configurations of a region of the structure in which a first metallic bump structure 20 is bonded to a second metallic bump structure 30 according to an embodiment of the present disclosure.

Figure 10A:
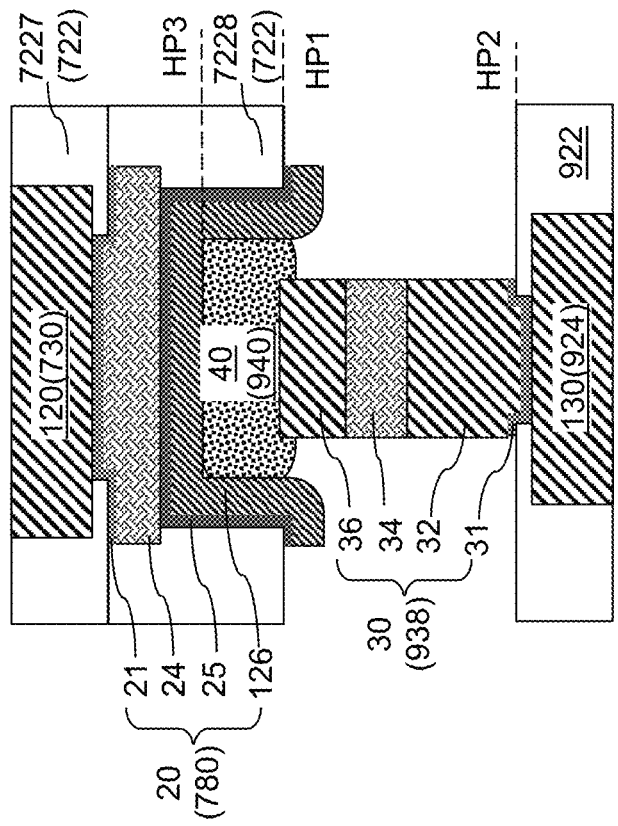
FIGS. 10A-10E are vertical cross-sectional views of third alternative configurations of a region of the structure in which a first metallic bump structure is bonded to a second metallic bump structure according to an embodiment of the present disclosure.

Referring to FIG. 10A, an alternative configuration of a bonding structure is illustrated, which may be derived from the bonding structure illustrated in FIG. 7B by exchanging locations of the first metallic bump structure 20 and the second metallic bump structure 30. In other words, the first metallic bump structure 20 is formed on a semiconductor die (701, 703) that functions as a first structure, and the second metallic bump structure 30 is formed on an interposer 900 that functions as a second structure. The first dielectric layers in the first structure includes a topmost interconnect-level dielectric material layer 7227 that laterally surrounds a topmost subset of the metal interconnect structures 730, and a passivation dielectric layer 7228 that laterally surrounds the first metallic bump structure 20.

In one embodiment, upon the array of first metallic bump structures 20 to the array of second metallic bump structures 30, a horizontal dielectric surface of a first structure (such as a semiconductor die (701, 703)) that is most proximal to the second structure (such as an interposer 900) may be located within a first horizontal plane HP1, and a horizontal dielectric surface of the second structure (such as the interposer 900) that is most proximal to the first structure (such as the semiconductor die (701, 703)) is located within a second horizontal plane HP2. In one embodiment, the array of solder material portions 40 contact the first horizontal bonding surface segments of the first metallic bump structure 20 within a third horizontal plane HP3, and an entirety of the array of solder material portions 40 may be formed between the first horizontal plane HP1 and the third horizontal plane HP3.

Figures 10B, 10C:
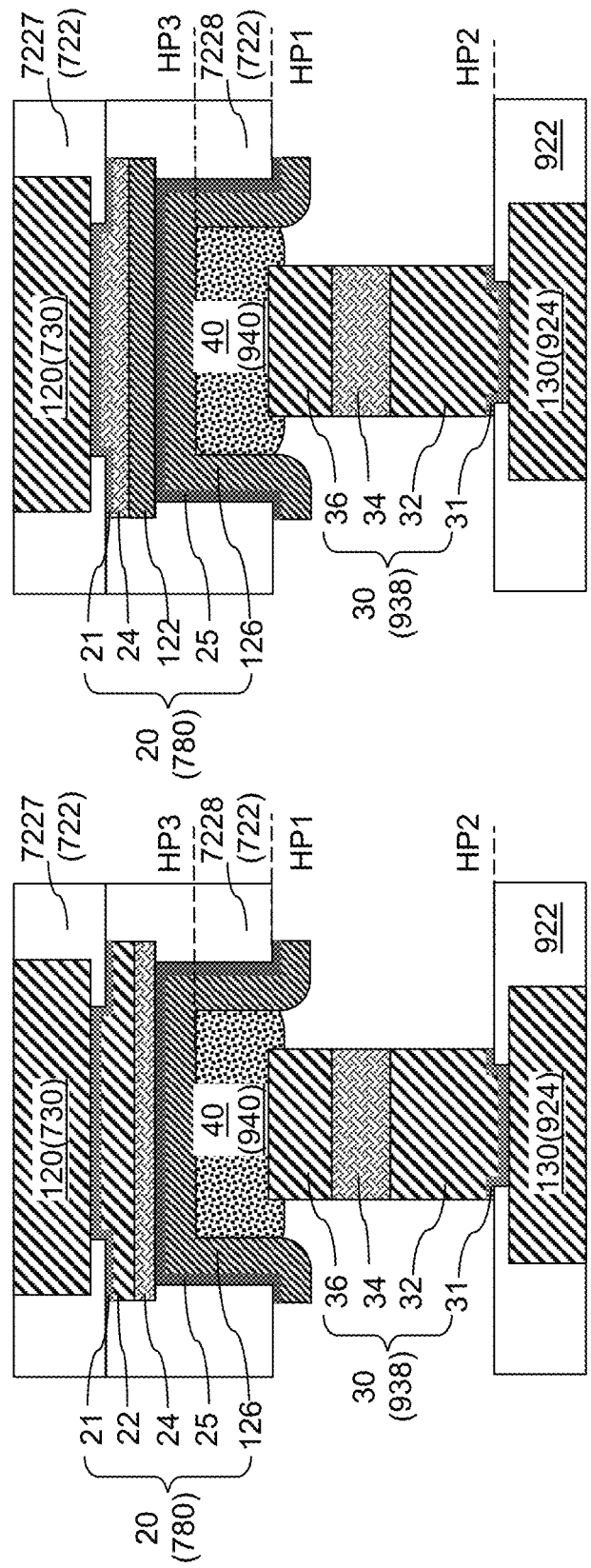

Referring to FIG. 10B, an alternative configuration of a bonding structure is illustrated, which may be derived from the bonding structure illustrated in FIG. 8A by exchanging locations of the first metallic bump structure 20 and the second metallic bump structure 30.

Referring to FIG. 10C, an alternative configuration of a bonding structure is illustrated, which may be derived from the bonding structure illustrated in FIG. 8B by exchanging locations of the first metallic bump structure 20 and the second metallic bump structure 30.

Figures 10D, 10E:
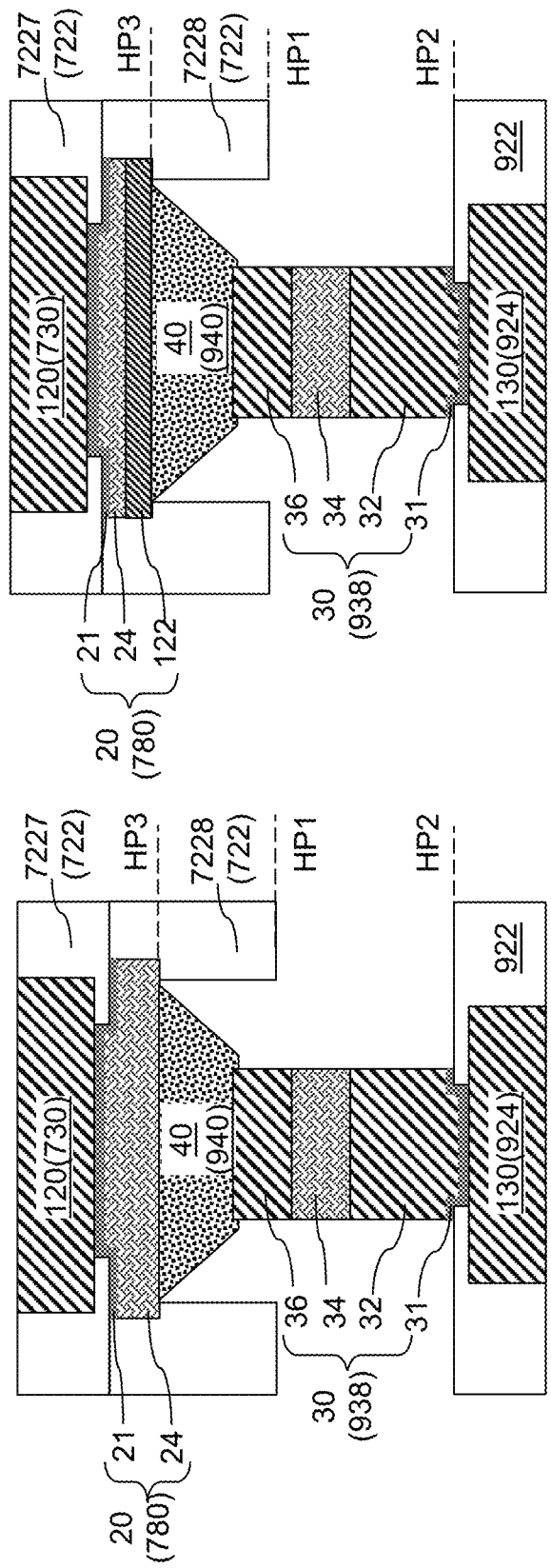

Referring to FIG. 10D, an alternative configuration of a bonding structure is illustrated, which may be derived from the bonding structure illustrated in FIG. 8C by exchanging locations of the first metallic bump structure 20 and the second metallic bump structure 30.

Referring to FIG. 10E, an alternative configuration of a bonding structure is illustrated, which may be derived from the bonding structure illustrated in FIG. 8D by exchanging locations of the first metallic bump structure 20 and the second metallic bump structure 30.

FIGS. 11A-11E are vertical cross-sectional views of fourth alternative configurations of a region of the structure in which a first metallic bump structure 20 is bonded to a second metallic bump structure 30 according to an embodiment of the present disclosure.

Figure 11A:
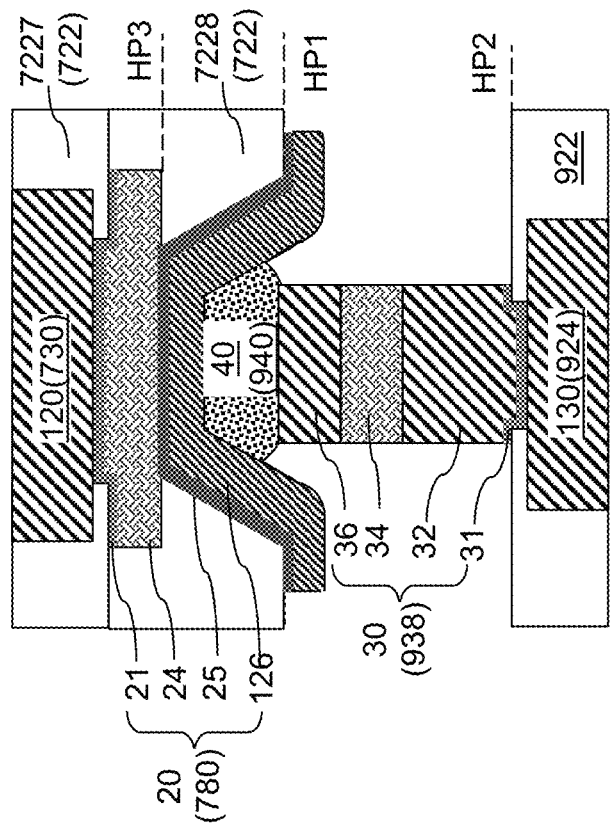
FIGS. 11A-11E are vertical cross-sectional views of fourth alternative configurations of a region of the structure in which a first metallic bump structure is bonded to a second metallic bump structure according to an embodiment of the present disclosure.

Referring to FIG. 11A, an alternative configuration of a bonding structure is illustrated, which may be derived from the bonding structure illustrated in FIG. 9A by exchanging locations of the first metallic bump structure 20 and the second metallic bump structure 30.

Figures 11B, 11C:
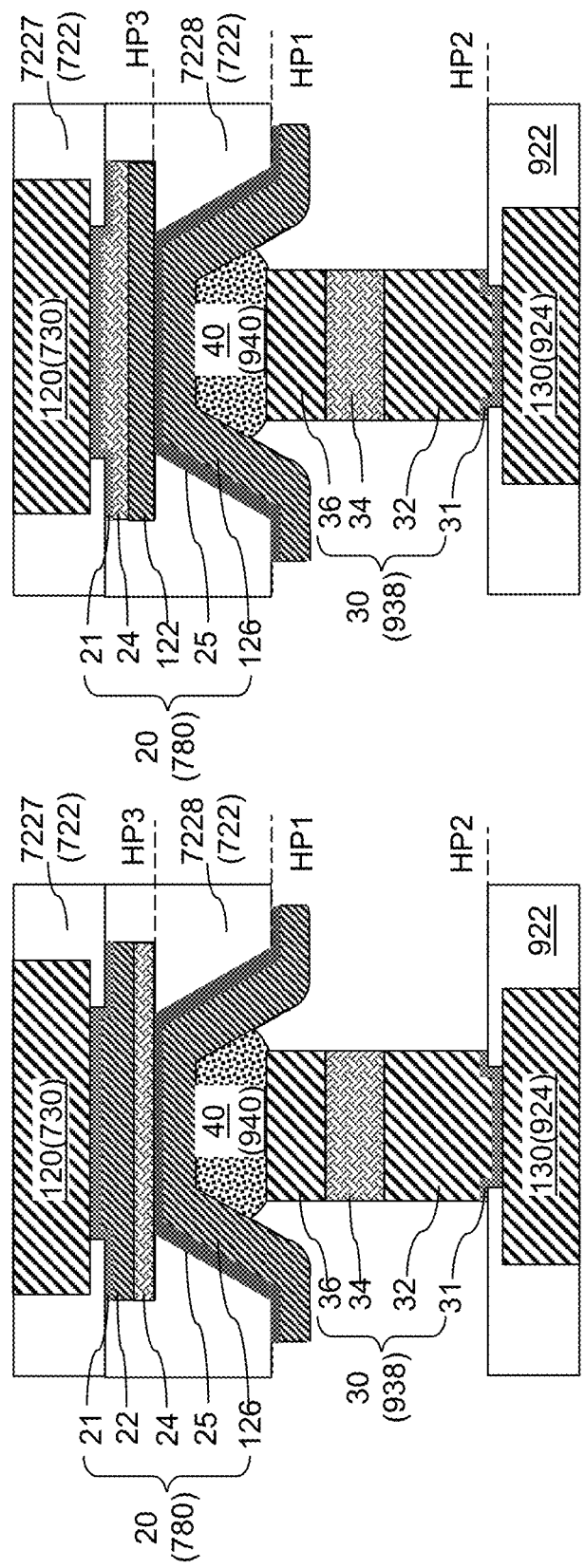

Referring to FIG. 11B, an alternative configuration of a bonding structure is illustrated, which may be derived from the bonding structure illustrated in FIG. 9B by exchanging locations of the first metallic bump structure 20 and the second metallic bump structure 30.

Referring to FIG. 11C, an alternative configuration of a bonding structure is illustrated, which may be derived from the bonding structure illustrated in FIG. 9C by exchanging locations of the first metallic bump structure 20 and the second metallic bump structure 30.

Figures 11D, 11E:
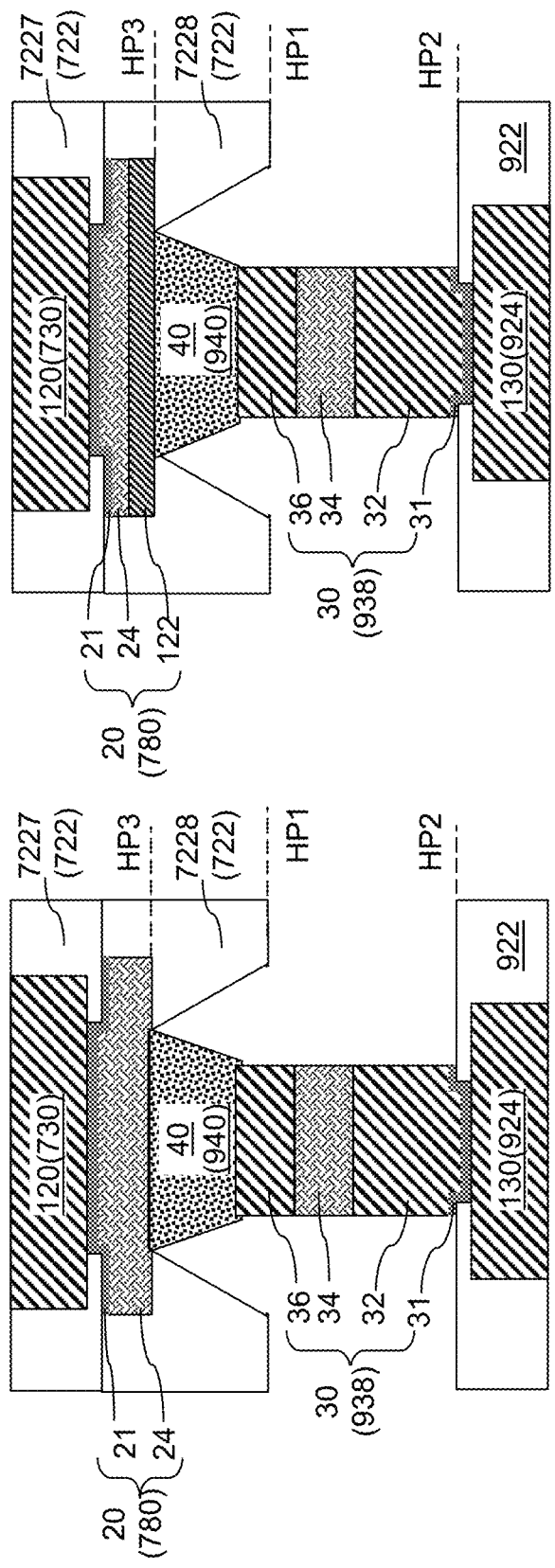

Referring to FIG. 11D, an alternative configuration of a bonding structure is illustrated, which may be derived from the bonding structure illustrated in FIG. 9D by exchanging locations of the first metallic bump structure 20 and the second metallic bump structure 30.

Referring to FIG. 11E, an alternative configuration of a bonding structure is illustrated, which may be derived from the bonding structure illustrated in FIG. 9E by exchanging locations of the first metallic bump structure 20 and the second metallic bump structure 30.

For each of the configurations illustrated in FIGS. 10B-11E, the first dielectric layers in the first structure includes a topmost interconnect-level dielectric material layer 7227 that laterally surrounds a topmost subset of the metal interconnect structures 730, and a passivation dielectric layer 7228 that laterally surrounds the first metallic bump structure 20.

Further, upon the array of first metallic bump structures 20 to the array of second metallic bump structures 30, a horizontal dielectric surface of a first structure (such as a semiconductor die (701, 703)) that is most proximal to the second structure (such as an interposer 900) may be located within a first horizontal plane HP1, and a horizontal dielectric surface of the second structure (such as the interposer 900) that is most proximal to the first structure (such as the semiconductor die (701, 703)) is located within a second horizontal plane HP2. In one embodiment, the array of solder material portions 40 contact the first horizontal bonding surface segments of the first metallic bump structure 20 within a third horizontal plane HP3, and an entirety of the array of solder material portions 40 may be formed between the first horizontal plane HP1 and the third horizontal plane HP3.

Referring collectively to FIGS. 6A-11E, a bonded assembly is provided, which comprises a first structure {interposer 900 or semiconductor die (701, 703)} and a second structure {semiconductor die (701, 703) or interposer 900} that are bonded to each other. The first structure {interposer 900 or semiconductor die (701, 703)} comprises first metallic connection structures 120 surrounded by first dielectric layers (922 or 722), a passivation dielectric layer (9228 or 7228) including an array of openings therein, and an array of first metallic bump structures 20 electrically connected to the first metallic connection structures 120 and having a respective first horizontal bonding surface segment that is vertically recessed from a first horizontal plane HP1 including a distal horizontal surface of the passivation dielectric layer (9228, 7228, or 2628). The second structure {semiconductor die (701, 703) or interposer 900} comprises second metallic connection structures 130 surrounded by second dielectric layers (722 or 922), and an array of second metallic bump structures 30 electrically connected to the second metallic connection structures 130 and having a respective second horizontal bonding surface segment that protrudes from a second horizontal plane HP2 including a distal horizontal surface of an dielectric layer selected from the second dielectric layers (722 or 922) that is most proximal to the first structure {interposer 900 or semiconductor die (701, 703)} toward the first structure {interposer 900 or semiconductor die (701, 703)}. The array of first metallic bump structures 20 is bonded to the array of second metallic bump structures 30 through an array of solder material portions 40. As in each of the embodiment structures of FIGS. 8A-11E, the second metallic bump structure 30 may be inserted into an opening formed in the first metallic bump structure 20, the second metallic bump structure 30 may also be referred to as a male metallic bump structure 30, the first metallic bump structure 20 may also be referred to as a female metallic bump structure 20.

In one embodiment, the first structure {interposer 900 or semiconductor die (701, 703)} comprises first metallic connection structures 120 surrounded by first dielectric layers (922 or 722). Each of the base bump plates (21, 22, 24, 122) is formed on a top surface of a respective one of the first metallic connection structures 120. The second structure {(701, 703) or 900} comprises second metallic connection structures 130 surrounded by second dielectric layers (722 or 922). Each of the second metallic bump structures 30 may be formed on a top surface of a respective one of the second metallic connection structures 130.

In one embodiment, bonding surfaces of the second metallic bump structures are more proximal to a third horizontal plane HP3 including the first horizontal bonding surface segment than the first horizontal plane HP1 is to the third horizontal plane HP3. In one embodiment, an entirety of the array of solder material portions 40 is located between the first horizontal plane HP1 and the third horizontal plane HP3. In one embodiment, one of the second metallic bump structures 30 has a maximum lateral dimensional that is less than a maximum lateral dimension of one of the first horizontal bonding surface segments that the one of the second metallic bump structures 30 contacts. In one embodiment, one of the second metallic bump structures 30 has a maximum lateral dimension that is less than a minimum lateral dimension of an opening selected from the array of openings in the passivation dielectric layer (9228 or 7228) within which the one of the second metallic bump structures 30 is located.

In one embodiment, each first metallic bump structure 20 within the array of first metallic bump structures 20 comprises a respective base bump plate (21, 22, 24, 122) having a bottom surface contacting a respective one of the first metallic connection structures 120, and having a top surface that is spaced from the bottom surface. In one embodiment, each first metallic bump structure 20 within the array of first metallic bump structures 20 comprises a respective contoured bump plate (25, 26, 126) containing a horizontally-extending bottom portion in contact with the base bump plate (21, 22, 24, 122) and a tapered or vertically-extending portion contacting a tapered or vertical sidewall of a respective opening selected from the array of openings in the passivation dielectric layer (9228 or 7228).

In one embodiment, the first horizontal bonding surface segments are surface segments of the horizontally-extending portions of the contoured bump plates (25, 26, 126). In one embodiment, the respective contoured bump plate (25, 26, 126) contains an annular horizontally-extending portion having an inner periphery that is adjoined to a top portion of the tapered or vertically-extending portion of the respective contoured bump plate (25, 26, 126).

In one embodiment, upon the array of first metallic bump structures 20 to the array of second metallic bump structures 30, a horizontal dielectric surface of the first structure {900 or (701, 703, or 200)} that is most proximal to the second structure {(701, 703, or 200) or 900} is located within a first horizontal plane HP1, and a horizontal dielectric surface of the second structure {(701, 703) or 900} that is most proximal to the first structure {900 or (701, 703)} is located within a second horizontal plane HP2. In one embodiment, the array of solder material portions 40 contact the first horizontal bonding surface segments within a third horizontal plane HP3, and an entirety of the array of solder material portions is formed between the first horizontal plane HP1 and the third horizontal plane HP3.

According to another aspect of the present disclosure, a bonded assembly is provided, which comprises a first structure {900 or (701, 703)} and a second structure {(701, 703) or 900} that are bonded to each other. The first structure {900 or (701, 703)} comprises an array of first metallic bump structures 20. The second structure {(701, 703) or 900} comprises an array of second metallic bump structures 30. Each first metallic bump structure 20 within the array of first metallic bump structures 20 has a respective first horizontal bonding surface segment that is vertically recessed away from the second structure {(701, 703) or 900} from a first horizontal plane HP1 including a horizontal dielectric surface of the first structure {900 or (701, 703)} that is most proximal to the second structure {(701, 703) or 900} selected from horizontal dielectric surfaces of the first structure {900 or (701, 703)}. Each second metallic bump structure 30 within the array of second metallic bump structures 30 has a respective second horizontal bonding surface segment that protrudes toward the first structure {900 or (701, 703)} from a second horizontal plane HP2 including a horizontal dielectric surface of the second structure {(701, 703) or 900} that is most proximal to the first structure {900 or (701, 703)} selected from horizontal dielectric surfaces of the second structure {(701, 703) or 900}. The array of first metallic bump structures 20 is bonded to the array of second metallic bump structures 30 through an array of solder material portions 40.

In one embodiment, one of the first structure {900 or (701, 703)} and the second structure {(701, 703) or 900} comprises a semiconductor die (701 or 703); and another of the first structure {900 or (701, 703)} and the second structure {(701, 703) or 900} comprises an interposer 900.

Figure 12:
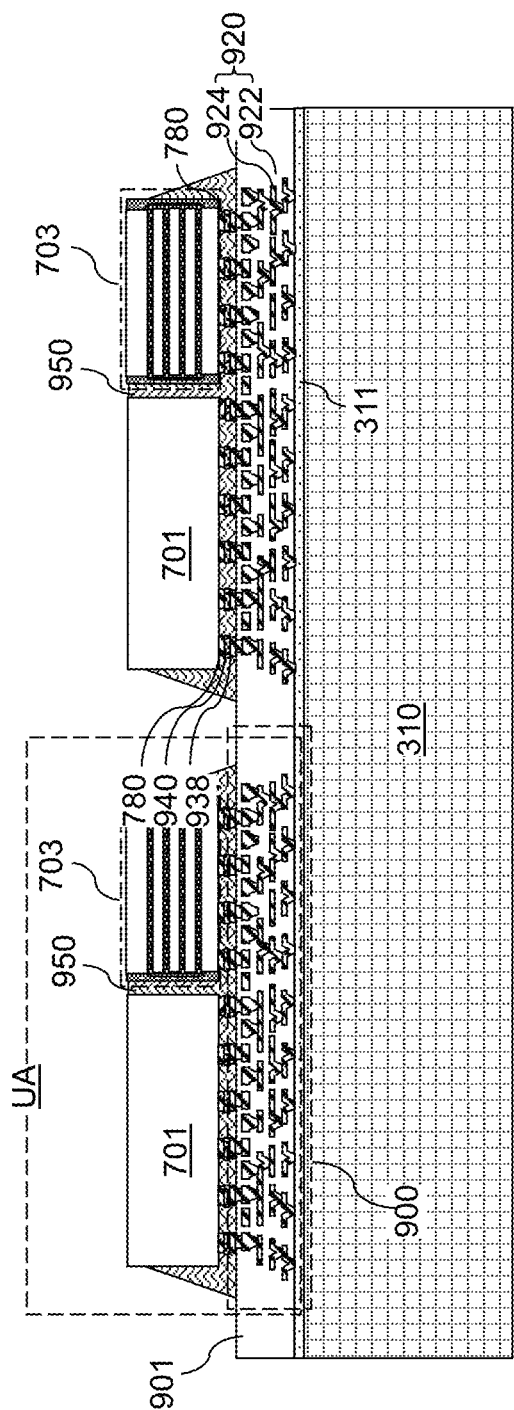
FIG. 12 is a vertical cross-sectional view of the structure after formation of first underfill material portions.

Referring to FIG. 12, a first underfill material may be applied into each gap between the interposers 900 and sets of at least one semiconductor die (701, 703) that are bonded to the interposers 900. The first underfill material may comprise any underfill material known in the art. A first underfill material portion 950 may be formed within each unit area UA between an interposer 900 and an overlying set of at least one semiconductor die (701, 703). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 may laterally surround, and contact, each of the first solder material portions 940 within the unit area UA. The first underfill material portion 950 may be formed around, and contact, the first solder material portions 940, the on-interposer bump structure 938, and the on-die bump structures 780 in the unit area UA. The first underfill material portion 950 is formed between semiconductor dies (701, 703) and an interposer 900, and thus, is also referred to as a die-interposer (DI) underfill material portion, or a DI underfill material portion.

Each interposer 900 in a unit area UA comprises on-interposer bump structure 938. At least one semiconductor die (701, 703) comprising a respective set of on-die bump structures 780 is attached to the on-interposer bump structure 938 through a respective set of first solder material portions 940 within each unit area UA. Within each unit area UA, a first underfill material portion 950 laterally surrounds the on-interposer bump structure 938 and the on-die bump structures 780 of the at least one semiconductor die (701, 703).

Generally, an underfill material portion 950 may be formed between each facing pair of the at least one interposer 900 and at least one set of the at least one semiconductor die (701, 703). In one embodiment, each interposer 900 comprises on-interposer bump structures 938 located above the horizontal plane including the first horizontal surface 901 of the interposer 900, and the horizontally-extending portion of the underfill material portion 950 is located above the horizontal plane including the first horizontal surface 901 of the interposer 900.

FIGS. 13A-13H are vertical cross-sectional views of a region of various configurations of the structure that includes a bonded pair of a first metallic bump structure and a second metallic bump structure according to an embodiment of the present disclosure.

Figures 13A, 13B:
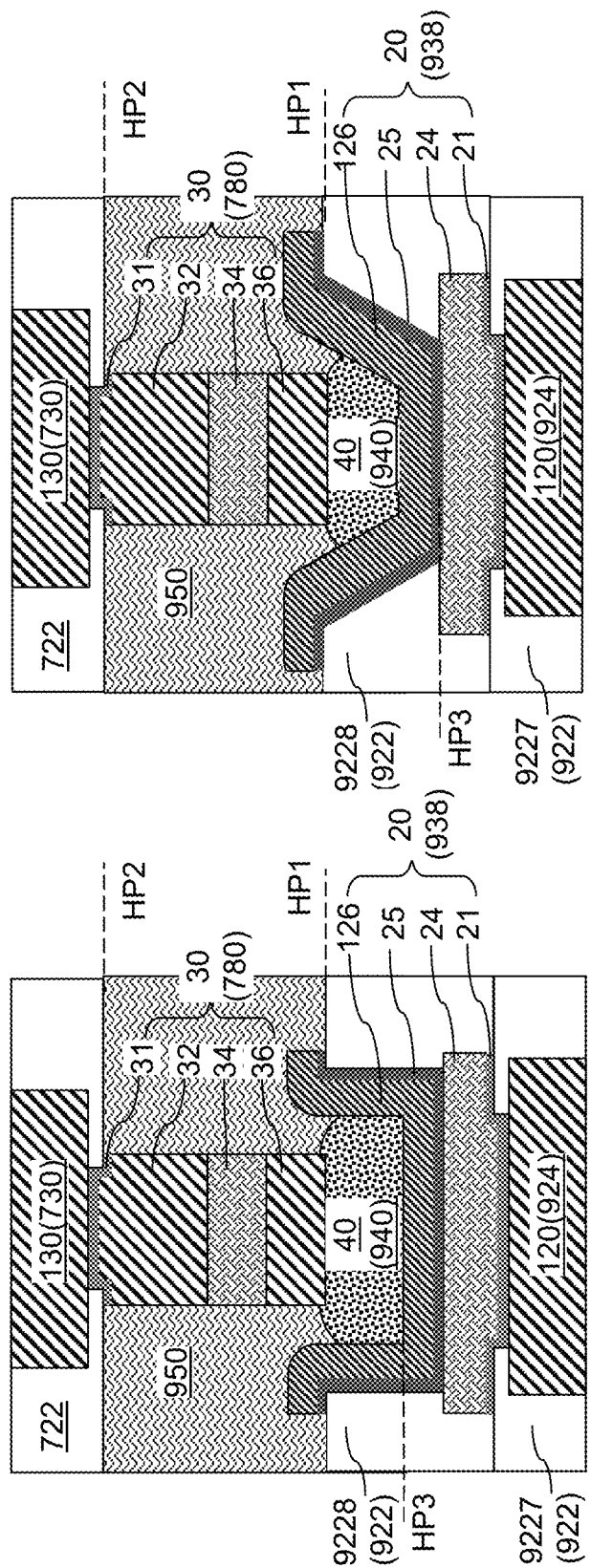

Referring to FIG. 13A, a configuration of a region of a bonding structure in the structure at the processing steps of FIG. 12 is illustrated. The configuration illustrated in FIG. 13A corresponds to the configuration illustrated in FIG. 7B.

Referring to FIG. 13B, a configuration of a region of a bonding structure in the structure at the processing steps of FIG. 12 is illustrated. The configuration illustrated in FIG. 13B corresponds to the configuration illustrated in FIG. 9A.

Figures 13C, 13D:
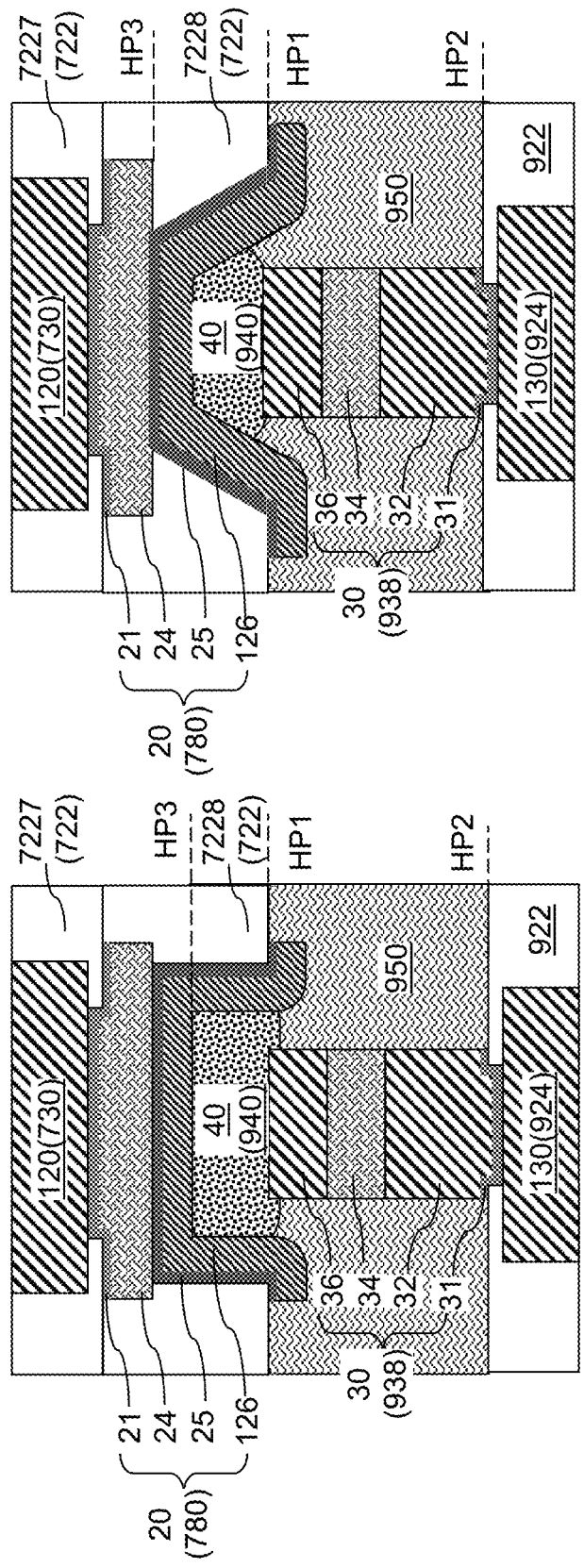

Referring to FIG. 13C, a configuration of a region of a bonding structure in the structure at the processing steps of FIG. 12 is illustrated. The configuration illustrated in FIG. 13C corresponds to the configuration illustrated in FIG. 10A.

Referring to FIG. 13D, a configuration of a region of a bonding structure in the structure at the processing steps of FIG. 12 is illustrated. The configuration illustrated in FIG. 13D corresponds to the configuration illustrated in FIG. 11A.

Referring to FIG. 13E, a configuration of a region of a bonding structure in the structure at the processing steps of FIG. 12 is illustrated. The configuration illustrated in FIG. 13E corresponds to the configuration illustrated in FIG. 8C.

Referring to FIG. 13F, a configuration of a region of a bonding structure in the structure at the processing steps of FIG. 12 is illustrated. The configuration illustrated in FIG. 13F corresponds to the configuration illustrated in FIG. 9D.

Figures 13G, 13H:
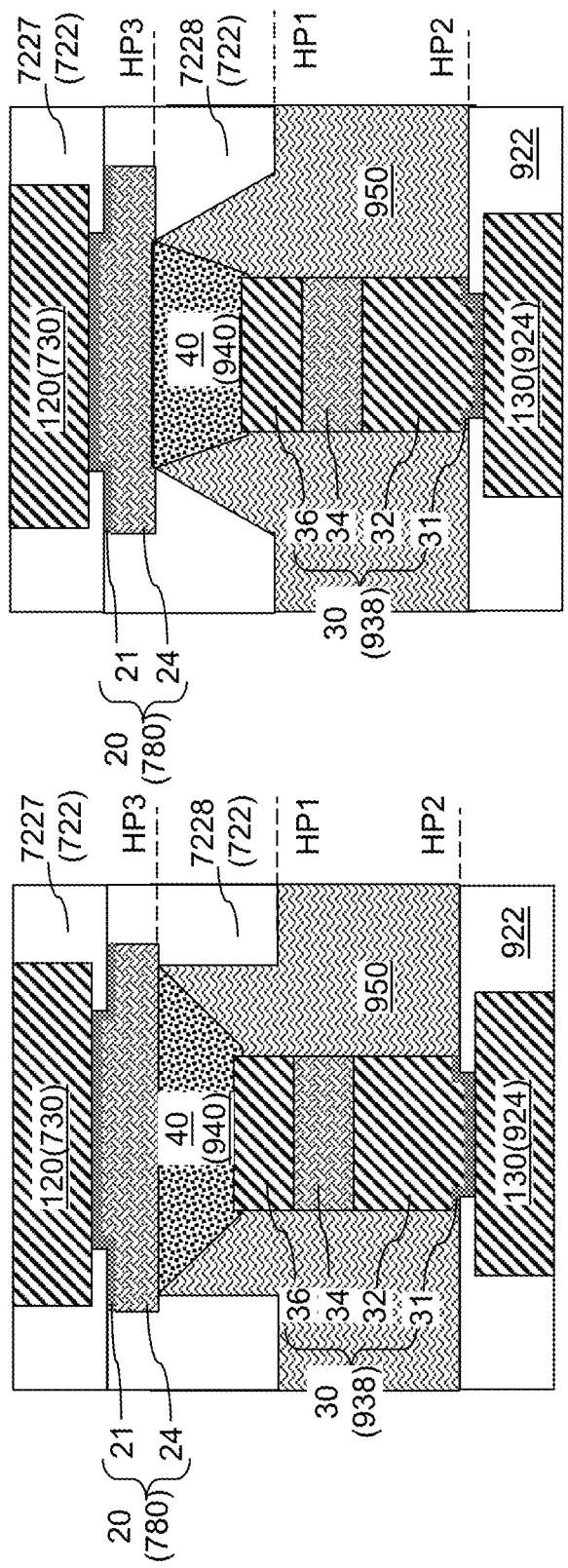

Referring to FIG. 13G, a configuration of a region of a bonding structure in the structure at the processing steps of FIG. 12 is illustrated. The configuration illustrated in FIG. 13G corresponds to the configuration illustrated in FIG. 10D.

Referring to FIG. 13H, a configuration of a region of a bonding structure in the structure at the processing steps of FIG. 12 is illustrated. The configuration illustrated in FIG. 13H corresponds to the configuration illustrated in FIG. 11D.

Referring collectively to FIGS. 12, 13A, 13B, 13C, and 13D, an underfill material portion 950 may laterally surrounding the array of solder material portions 40 (such as the first solder material portions 940). In some embodiments, such as in embodiments illustrated in FIGS. 13A, 13C, and 13E-13H, the underfill material portion 950 may be in contact with the first horizontal bonding surface segments of the first metallic bump structures 20.

In some embodiments, such as in embodiments illustrated in FIGS. 13A-13D, each first metallic bump structure 20 within the array of first metallic bump structures 20 comprises a respective contoured bump plate (25, 26, 126) contacting the passivation dielectric layer (9228 or 7228) at the openings in the passivation dielectric layer (9228 or 7228). In some embodiments, such as in embodiments illustrated in FIGS. 13A-13D, each opening within the array of openings comprises a tapered or vertical dielectric surface of the passivation dielectric layer (9228 or 7228) that is spaced from the underfill material portion (950 or 292) by a respective one of the contoured bump plates (25, 26, 126). In some embodiments, such as in embodiments illustrated in FIGS. 13E-13H, each opening within the array of openings comprises a tapered or vertical dielectric surface of the passivation dielectric layer (9228 or 7228) that contacts the underfill material portion (950 or 292). Configurations of the structure at the processing steps of FIG. 12 that correspond to the configurations of FIGS. 8A, 8B, 8D, 9B, 9C, 9E, 10B, 10C, 10E, 11B, 11C, and 11E are expressly contemplated herein.

Figure 14A:
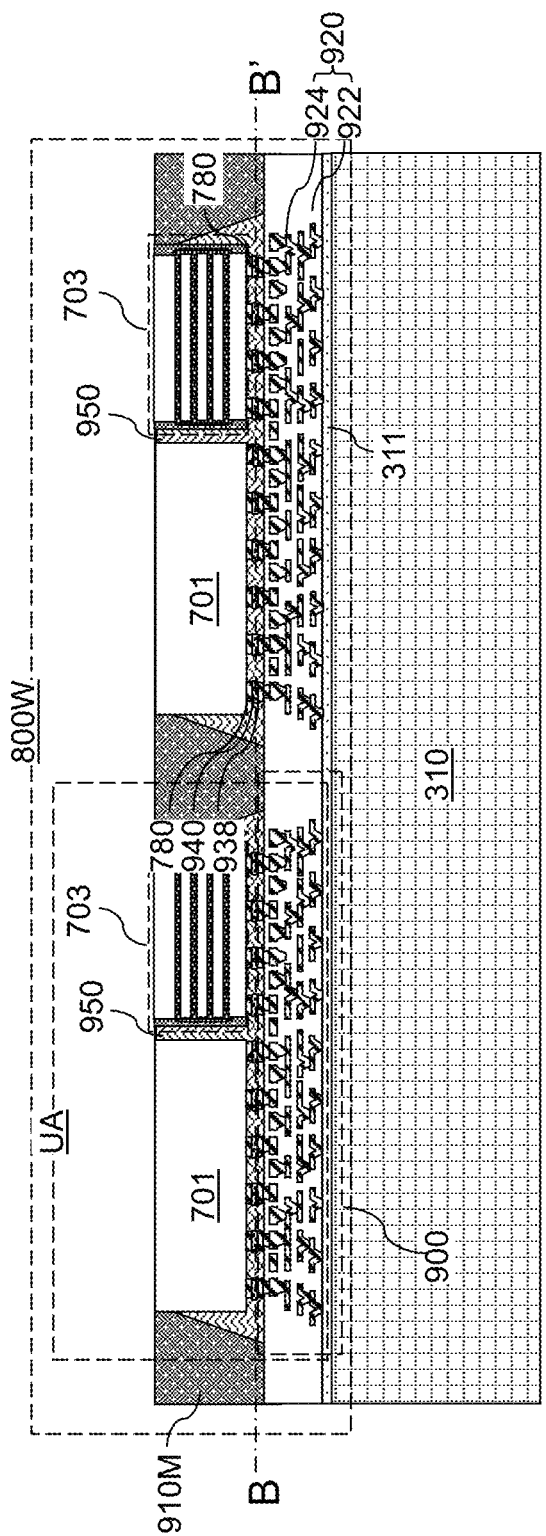
FIG. 14A is a vertical cross-sectional view of the structure after formation of an epoxy molding compound (EMC) matrix according to an embodiment of the present disclosure.
Figure 14B:
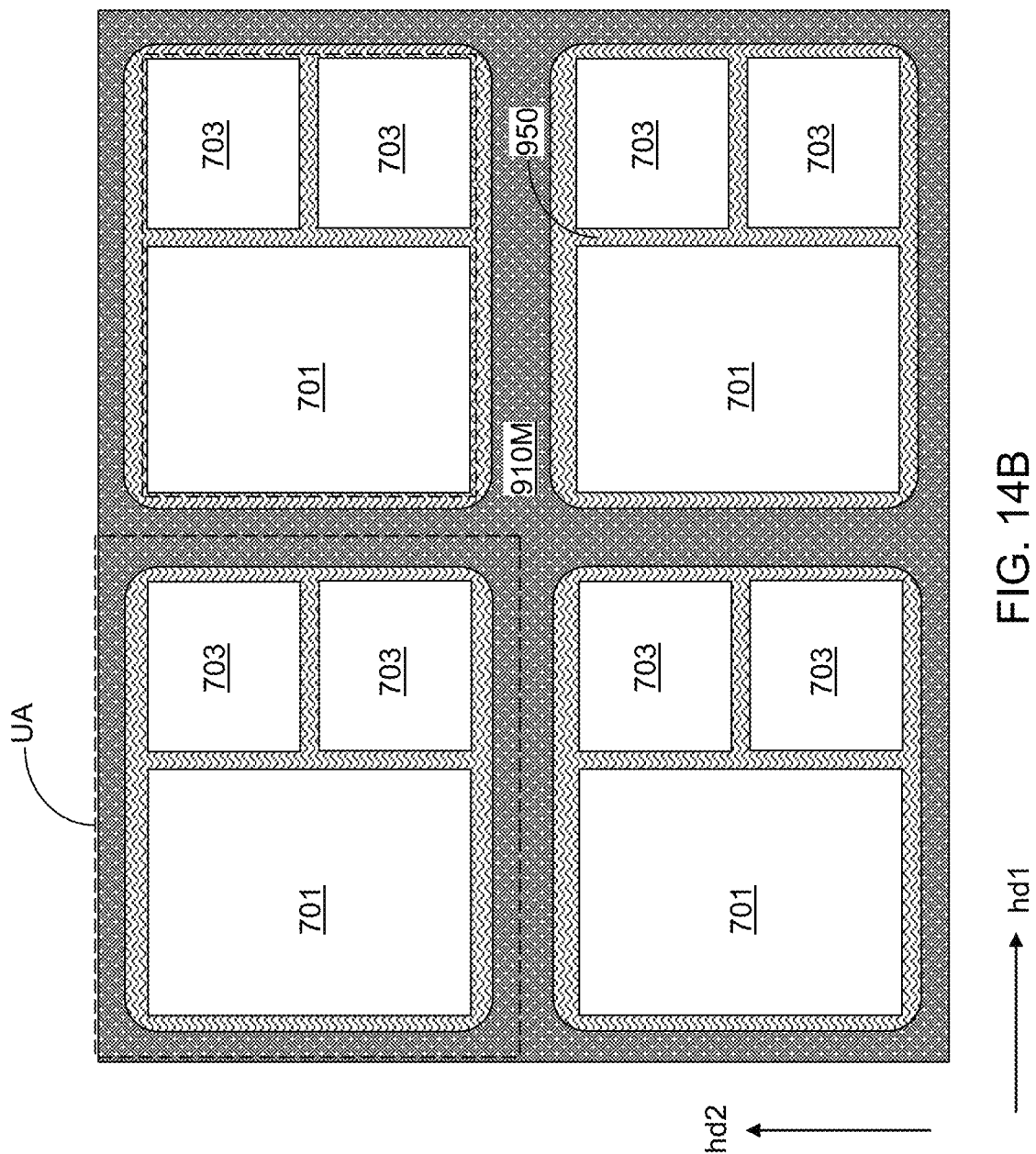
FIG. 14B is a horizontal cross-sectional view of the structure along the horizontal plane B-B' of FIG. 14A.

Referring to FIGS. 14A and 14B, an epoxy molding compound (EMC) may be applied to the gaps between contiguous assemblies of a respective set of semiconductor dies (701, 703) and a first underfill material portion 950.

The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be lower than the release (debonding) temperature of the first adhesive layer 311 in embodiments in which the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (701, 703) and a first underfill material portion 950. The EMC matrix 910M includes a plurality of epoxy molding compound (EMC) die frames that may be laterally adjoined to one another. Each EMC die frame is a portion of the EMC matrix 910M that is located within a respective unit area UA. Thus, each EMC die frame laterally surrounds and embeds a respective a set of semiconductor dies (701, 703) and a respective first underfill material portion 950. Young's modulus of pure epoxy is about 3.35 GPa, and Young's modulus of the EMC may be higher than Young's modulus of pure epoxy by adding additives. Young's modulus of EMC may be greater than 3.5 GPa.

Portions of the EMC matrix 910M that overlies the horizontal plane including the top surfaces of the semiconductor dies (701, 703) may be removed by a planarization process. For example, the portions of the EMC matrix 910M that overlies the horizontal plane may be removed using a chemical mechanical planarization (CMP). The combination of the remaining portion of the EMC matrix 910M, the semiconductor dies (701, 703), the first underfill material portions 950, and the two-dimensional array of interposers 900 comprises a reconstituted wafer 800W. Each portion of the EMC matrix 910M located within a unit area UA constitutes an EMC die frame.

Figure 15:
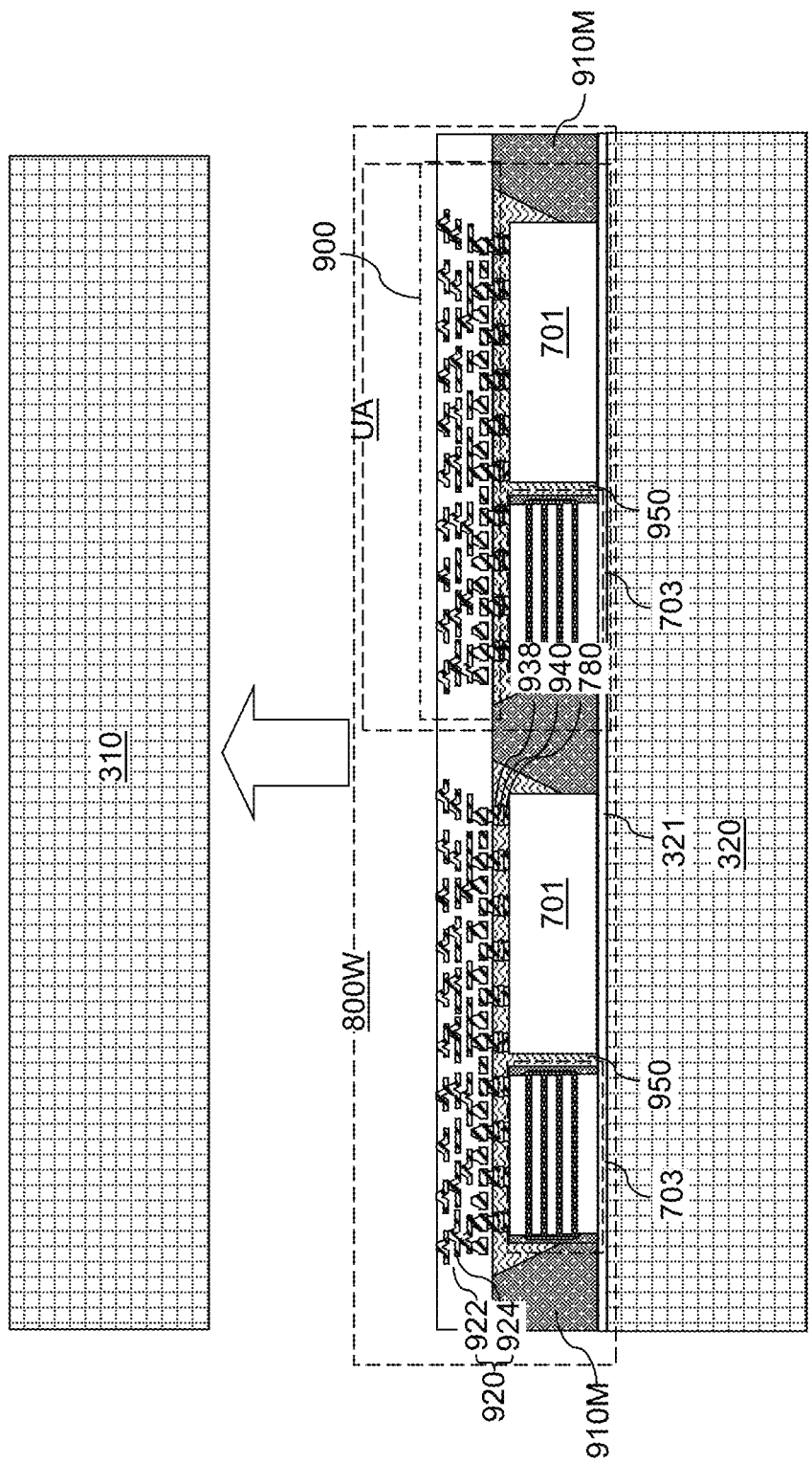
FIG. 15 is a vertical cross-sectional view of a region of the structure after attaching a second carrier substrate and detaching the first carrier substrate according to an embodiment of the present disclosure.

Referring to FIG. 15, a second adhesive layer 321 may be applied to the physically exposed planar surface of the reconstituted wafer 800W, i.e., the physically exposed surfaces of the EMC matrix 910M, the semiconductor dies (701, 703), and the first underfill material portions 950. In one embodiment, the second adhesive layer 321 may comprise a same material as, or may comprise a different material from, the material of the first adhesive layer 311. In embodiments in which the first adhesive layer 311 comprises a thermally decomposing adhesive material, the second adhesive layer 321 may comprise another thermally decomposing adhesive material that decomposes at a higher temperature, or may comprise a light-to-heat conversion material.

A second carrier substrate 320 may be attached to the second adhesive layer 321. The second carrier substrate 320 may be attached to the opposite side of the reconstituted wafer 800W relative to the first carrier substrate 310. Generally, the second carrier substrate 320 may comprise any material that may be used for the first carrier substrate 310. The thickness of the second carrier substrate 320 may be in a range from 500 microns to 2,000 microns, although lesser and greater thicknesses may also be used.

The first adhesive layer 311 may be decomposed by ultraviolet radiation or by a thermal anneal at a debonding temperature. In embodiments in which the first carrier substrate 310 includes an optically transparent material and the first adhesive layer 311 includes an LTHC layer, the first adhesive layer 311 may be decomposed by irradiating ultraviolet light through the transparent carrier substrate. The LTHC layer may be absorb the ultraviolet radiation and generate heat, which decomposes the material of the LTHC layer and cause the transparent first carrier substrate 310 to be detached from the reconstituted wafer 800W. In embodiments in which the first adhesive layer 311 includes a thermally decomposing adhesive material, a thermal anneal process at a debonding temperature may be performed to detach the first carrier substrate 310 from the reconstituted wafer 800W.

Figure 16:
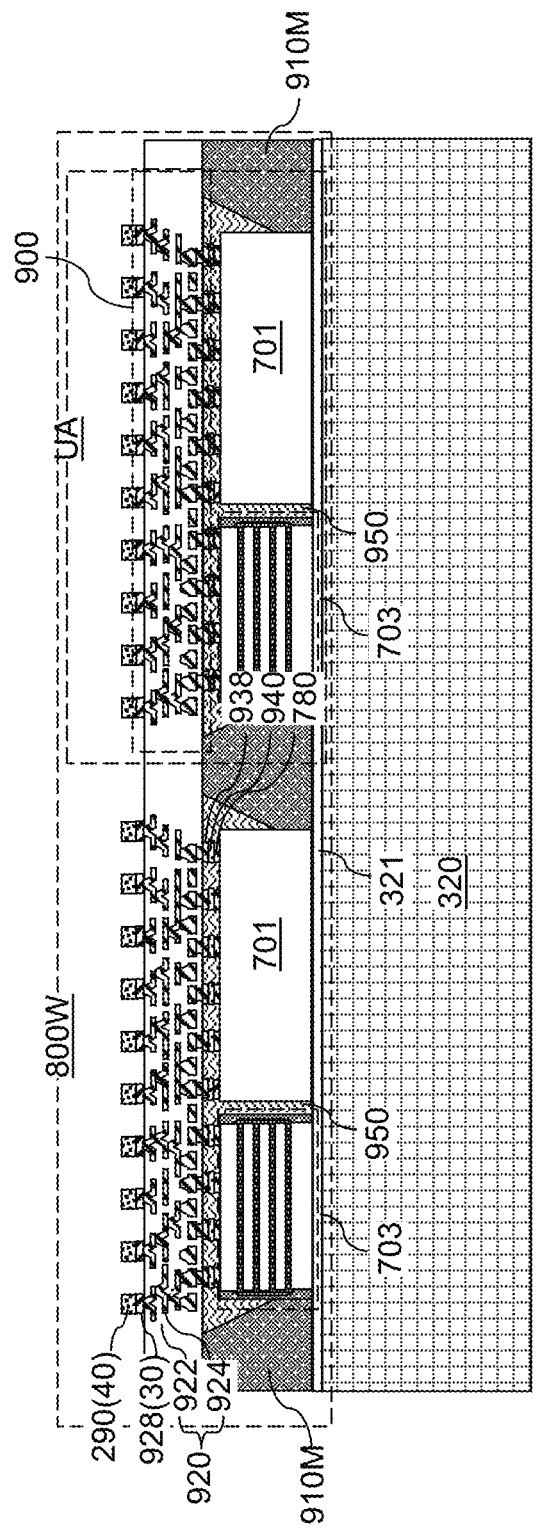
FIG. 16 is a vertical cross-sectional view of a region of the structure after formation of fan-out bonding pads and second solder material portions according to an embodiment of the present disclosure.

Referring to FIG. 16, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from microns to 50 microns.

The fan-out bonding pads 928 and the second solder material portions 290 may be formed on the opposite side of the EMC matrix 910M and the two-dimensional array of sets of semiconductor dies (701, 703) relative to the interposer layer. The interposer layer includes a three-dimensional array of interposers 900. Each interposer 900 may be located within a respective unit area UA. Each interposer 900 may include redistribution dielectric layers 922, redistribution wiring interconnects 924 embedded in the redistribution dielectric layers 922, and fan-out bonding pads 928. The fan-out bonding pads 928 may be located on an opposite side of the on-interposer bump structure 938 relative to the redistribution dielectric layers 922, and may be electrically connected to a respective one of the on-interposer bump structure 938.

According to an aspect of the present disclosure, the fan-out bonding pads 928 may be formed as second metallic bump structures 30 described above. In this embodiment, the interposer 900 may function as a second structure as far as the fan-out bonding pads 928 are concerned. In other words, the fan-out bonding pads 928 may be formed with the same structural characteristics as the second metallic bump structures described above, the interposer 900 functions as the second structure, and the redistribution dielectric layer 922 may function as second dielectric layers of the second structure. Formation of the fan-out bonding pads 928 as the second metallic bump structures 30 is optional, and may be performed independent of any geometry selected for the first metallic bonding structures 20 and the second metallic bonding structures that are formed for bonding between the interposer 900 and the semiconductor dies (701, 703).

Figure 17:
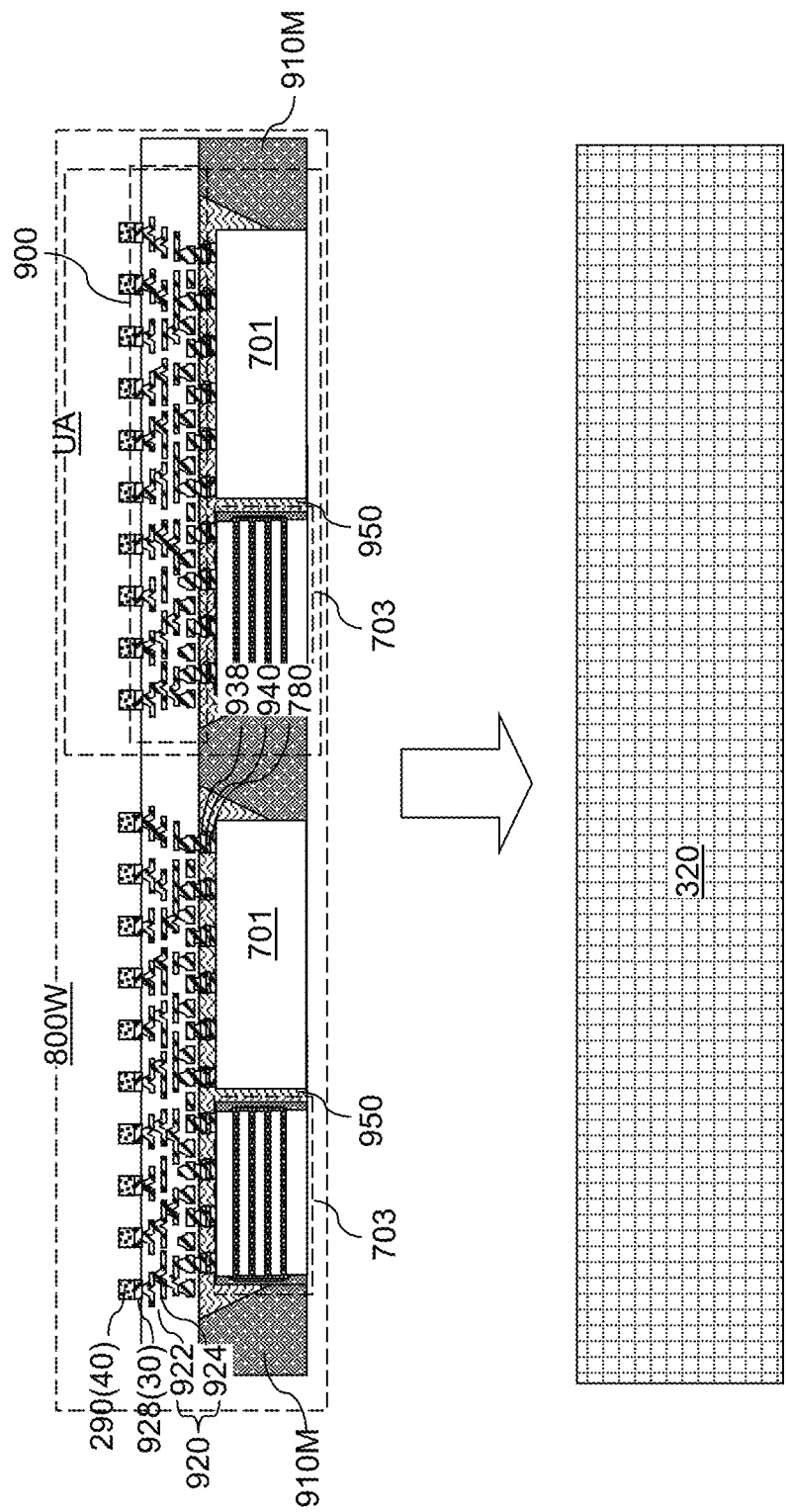
FIG. 17 is a vertical cross-sectional view of a region of the structure after detaching the second carrier substrate according to an embodiment of the present disclosure.

Referring to FIG. 17, the second adhesive layer 321 may be decomposed by ultraviolet radiation or by a thermal anneal at a debonding temperature. In embodiments in which the second carrier substrate 320 includes an optically transparent material and the second adhesive layer 321 includes an LTHC layer, the second adhesive layer 321 may be decomposed by irradiating ultraviolet light through the transparent carrier substrate. In embodiments in which the second adhesive layer 321 includes a thermally decomposing adhesive material, a thermal anneal process at a debonding temperature may be performed to detach the second carrier substrate 320 from the reconstituted wafer 800W.

Figure 18:
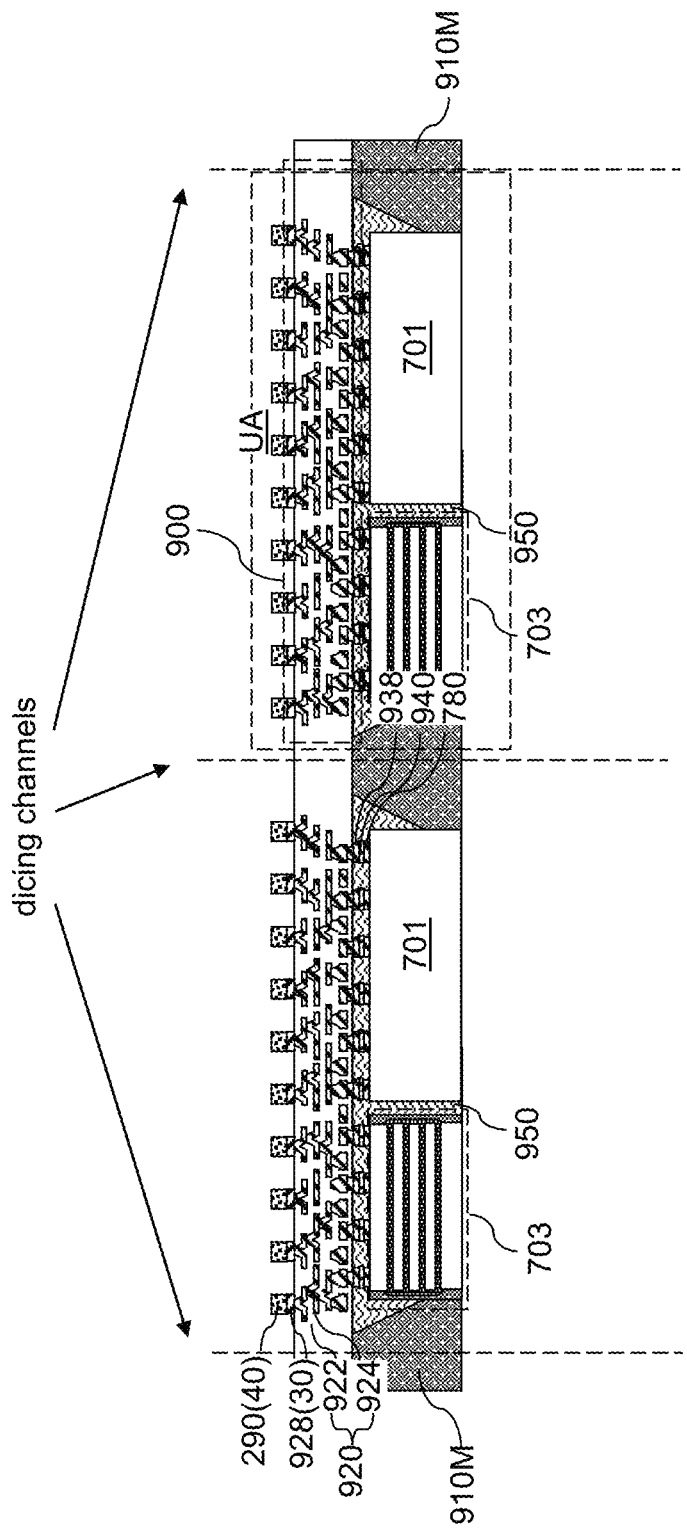
FIG. 18 is a vertical cross-sectional view of a region of the structure during dicing of a redistribution substrate and the EMC matrix according to an embodiment of the present disclosure.

Referring to FIG. 18, the reconstituted wafer 800W including the fan-out bonding pads 928 may be subsequently diced along dicing channels by performing a dicing process. The dicing channels correspond to the boundaries between neighboring pairs of die areas DA. Each diced unit from the reconstituted wafer 800W may include a fan-out package 800. In other words, each diced portion of the assembly of the two-dimensional array of sets of semiconductor dies (701, 703), the two-dimensional array of first underfill material portions 950, the EMC matrix 910M, and the two-dimensional array of interposers 900 constitutes a fan-out package 800. Each diced portion of the EMC matrix 910M constitutes a molding compound die frame 910. Each diced portion of the interposer layer (which includes the two-dimensional array of interposers 900) constitutes an interposer 900.

Figure 19A:
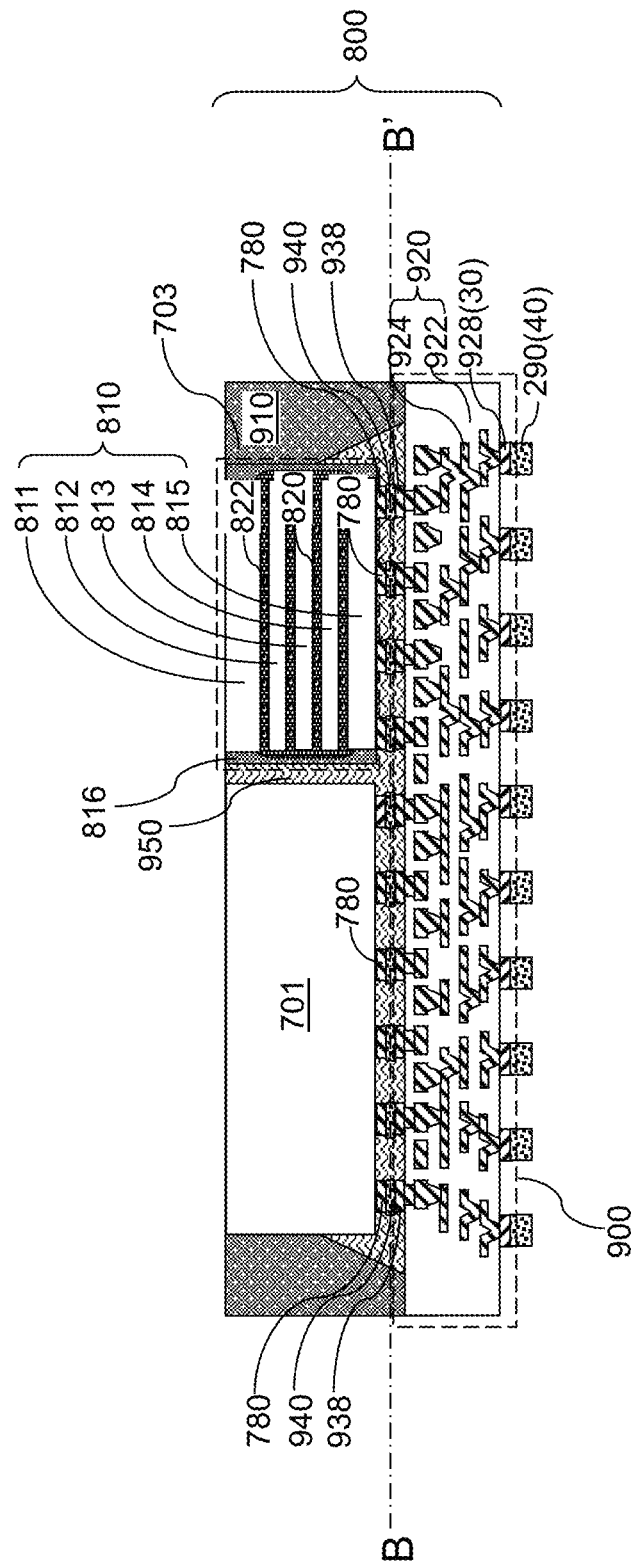
FIG. 19A is a vertical cross-sectional view of a fan-out package according to an embodiment of the present disclosure.
Figure 19B:
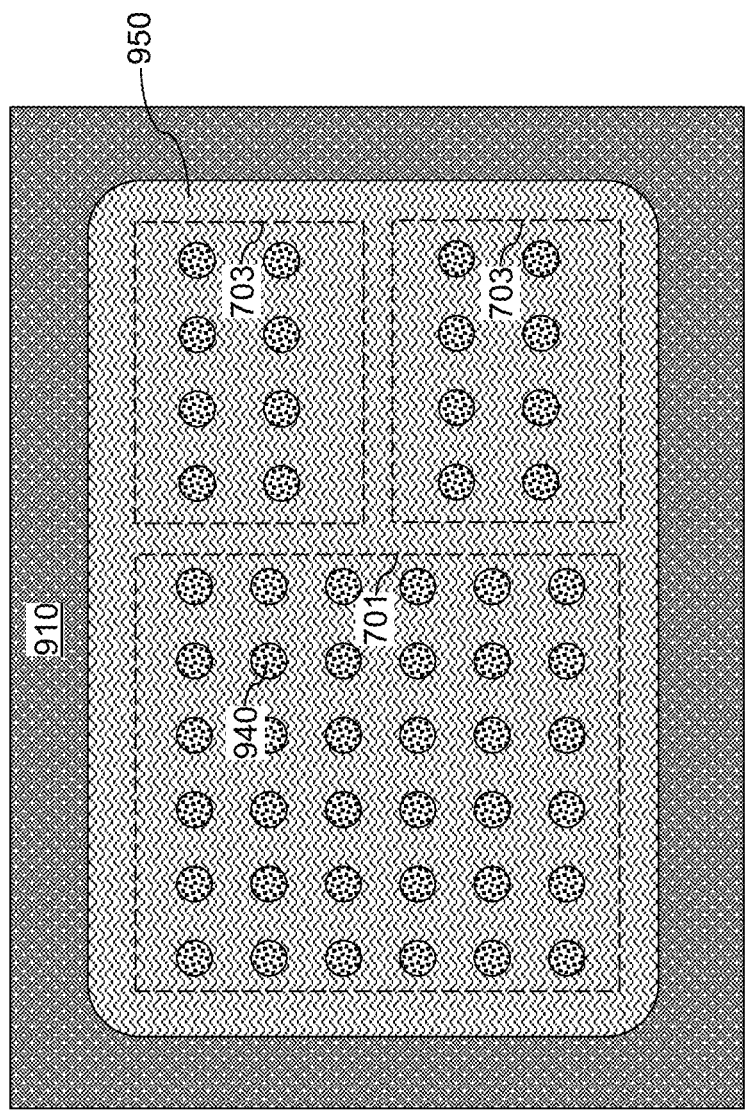
FIG. 19B is a horizontal cross-sectional view of the fan-out package along the horizontal plane B-B' of FIG. 19A.

Referring to FIGS. 19A and 19B, a fan-out package 800 obtained by dicing the intermediate structure at the processing steps of FIG. 18 is illustrated. The fan-out package 800 comprises an interposer 900 including on-interposer bump structure 938, at least one semiconductor die (701, 703) comprising a respective set of on-die bump structures 780 that is attached to the on-interposer bump structure 938 through a respective set of first solder material portions 940, a first underfill material portion 950 laterally surrounding the on-interposer bump structure 938 and the on-die bump structures 780 of the at least one semiconductor die (701, 703).

The fan-out package 800 may comprise a molding compound die frame 910 laterally surrounding the at least one semiconductor die (701, 703) and comprising a molding compound material. In one embodiment, the molding compound die frame 910 may include sidewalls that are vertically coincident with sidewalls of the interposer 900, i.e., located within same vertical planes as the sidewalls of the interposer 900. Generally, the molding compound die frame 910 may be formed around the at least one semiconductor die (701, 703) after formation of the first underfill material portion 950 within each fan-out package 800. The molding compound material contacts a peripheral portion of a planar surface of the interposer 900.

Figure 20A:
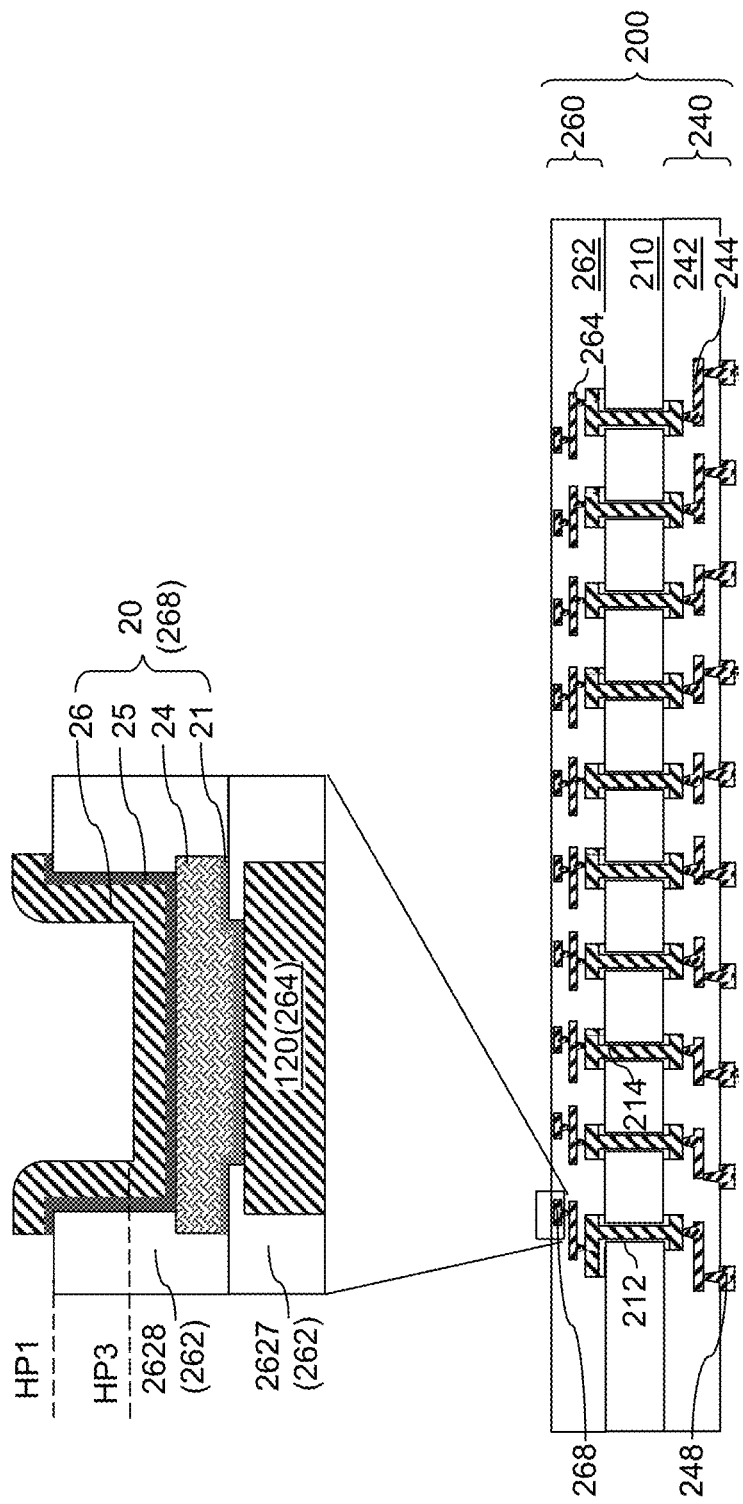
FIG. 20A is a vertical cross-sectional view of a packaging substrate according to an embodiment of the present disclosure.
Figure 20B:
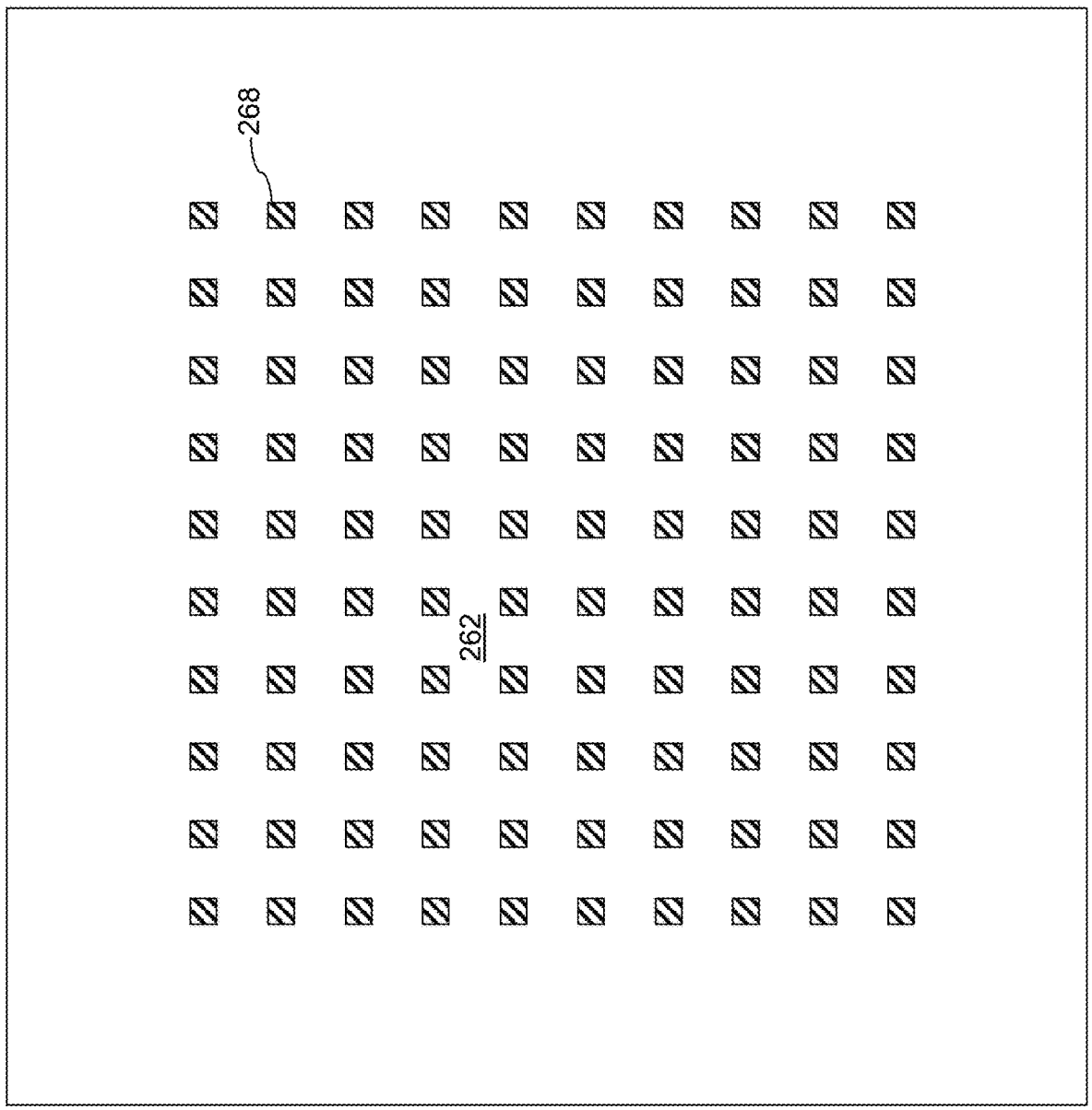
FIG. 20B is a top-down view of the packaging substrate of FIG. 20A.

Referring to FIGS. 20A and 20B, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 may be configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

In embodiments in which the fan-out bonding pads 928 are formed as second metallic bump structures 30, the chip-side bonding pads 268 may be formed as first metallic bump structures 20 described above. In this embodiment, the packaging substrate 200 may function as a first structure as far as the chip-side bonding pads 268 are concerned. In other words, the chip-side bonding pads 268 may be formed with the same structural characteristics as the first metallic bump structures 20 described above, the packaging substrate 200 functions as the first structure, and the chip-side insulating layers 262 may function as first dielectric layers of the first structure. The chip-side wiring interconnects 264 may function as first connection structures 120 in the first structure. In one embodiment, the chip-side insulating layers 262 may comprise an interconnection-level insulating layer 2627 that laterally surrounds the chip-side wiring interconnects 264, and a passivation dielectric layer 2628 that laterally surrounds the first metallic bump structures 20 (comprising the chip-side bonding pads 268). Formation of the fan-out bonding pads 928 as the second metallic bump structures 30 and formation of the chip-side bonding pads 268 as the first metallic bump structures 20 is optional, and may be performed independent of any geometry selected for the first metallic bonding structures 20 and the second metallic bonding structures 30 that are formed for bonding between the interposer 900 and the semiconductor dies (701, 703).

In an alternative embodiment, the fan-out bonding pads 928 are formed as first metallic bump structures 20, and the chip-side bonding pads 268 may be formed as second metallic bump structures 30 described above. In other words, the positions of the first metallic bump structures 20 and the second metallic bump structures 30 may be reversed between the interposer 900 and the packaging substrate 200. In this embodiment, the interposer 900 may function as a first structure, and the packaging substrate 200 may function as a second structure. The redistribution dielectric layers 922 may function as first dielectric layers of the first structure, the chip-side insulating layers 262 may function as second dielectric layers of the second structure. The redistribution wiring interconnects 924 may function as first connection structures 120 in the first structure. The chip-side wiring interconnects 264 may function as second connection structures 130 in the first structure. Formation of the fan-out bonding pads 928 as the first metallic bump structures 20 and formation of the chip-side bonding pads 268 as the second metallic bump structures 30 is optional, and may be performed independent of any geometry selected for the first metallic bonding structures 20 and the second metallic bonding structures 30 that are formed for bonding between the interposer 900 and the semiconductor dies (701, 703).

Figure 21:
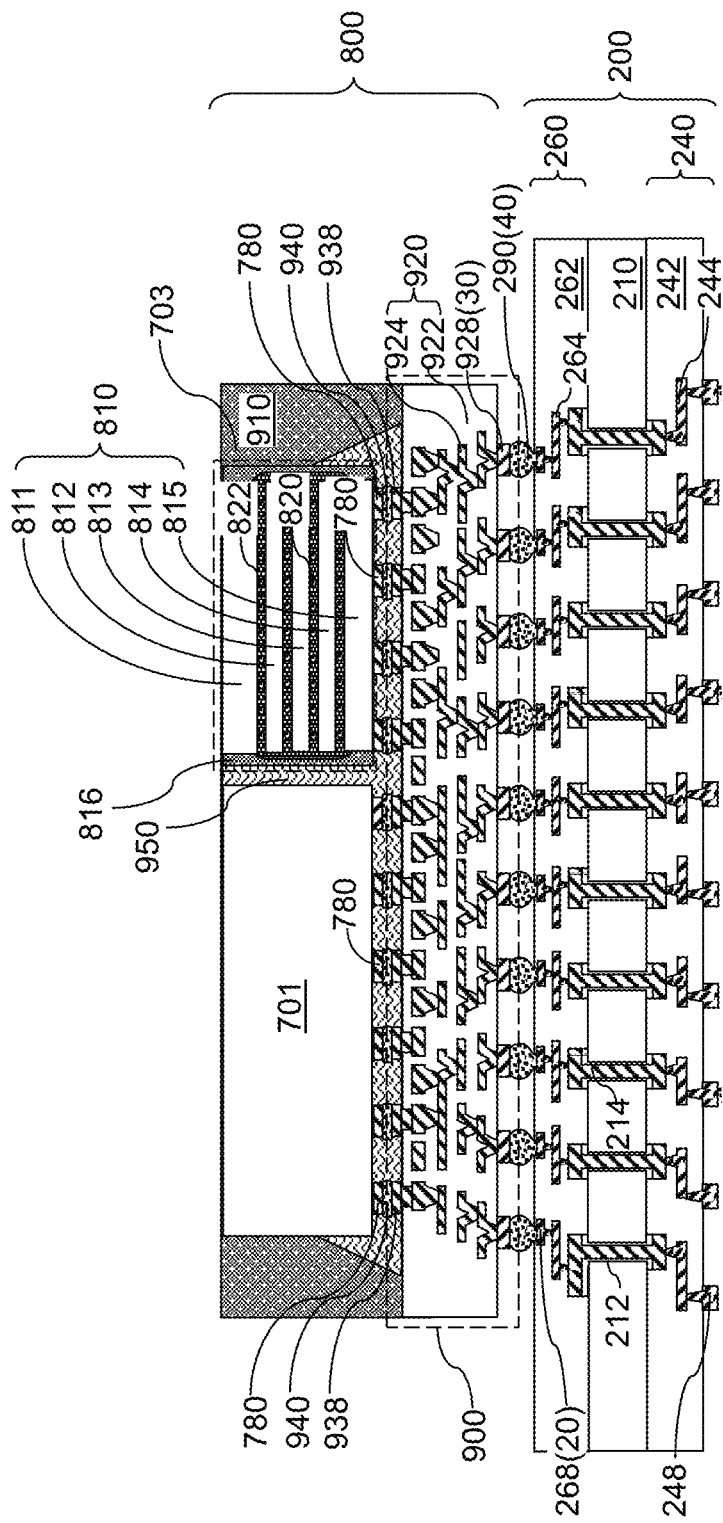
FIG. 21 is a vertical cross-sectional view of an structure after attaching the fan-out package to the packaging substrate according to an embodiment of the present disclosure.

Referring to FIG. 21, the fan-out package 800 may be disposed over the packaging substrate 200 with an array of the second solder material portions 290 therebetween. In embodiments in which the second solder material portions 290 are formed on the fan-out bonding pads 928 of the fan-out package 800, the second solder material portions 290 may be disposed on the chip-side bonding pads 268 of the packaging substrate 200. A reflow process may be performed to reflow the second solder material portions 290, thereby inducing bonding between the fan-out package 800 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 900 is bonded to the packaging substrate 200 by an array of solder material portions (such as the second solder material portions 290).

Figure 22:
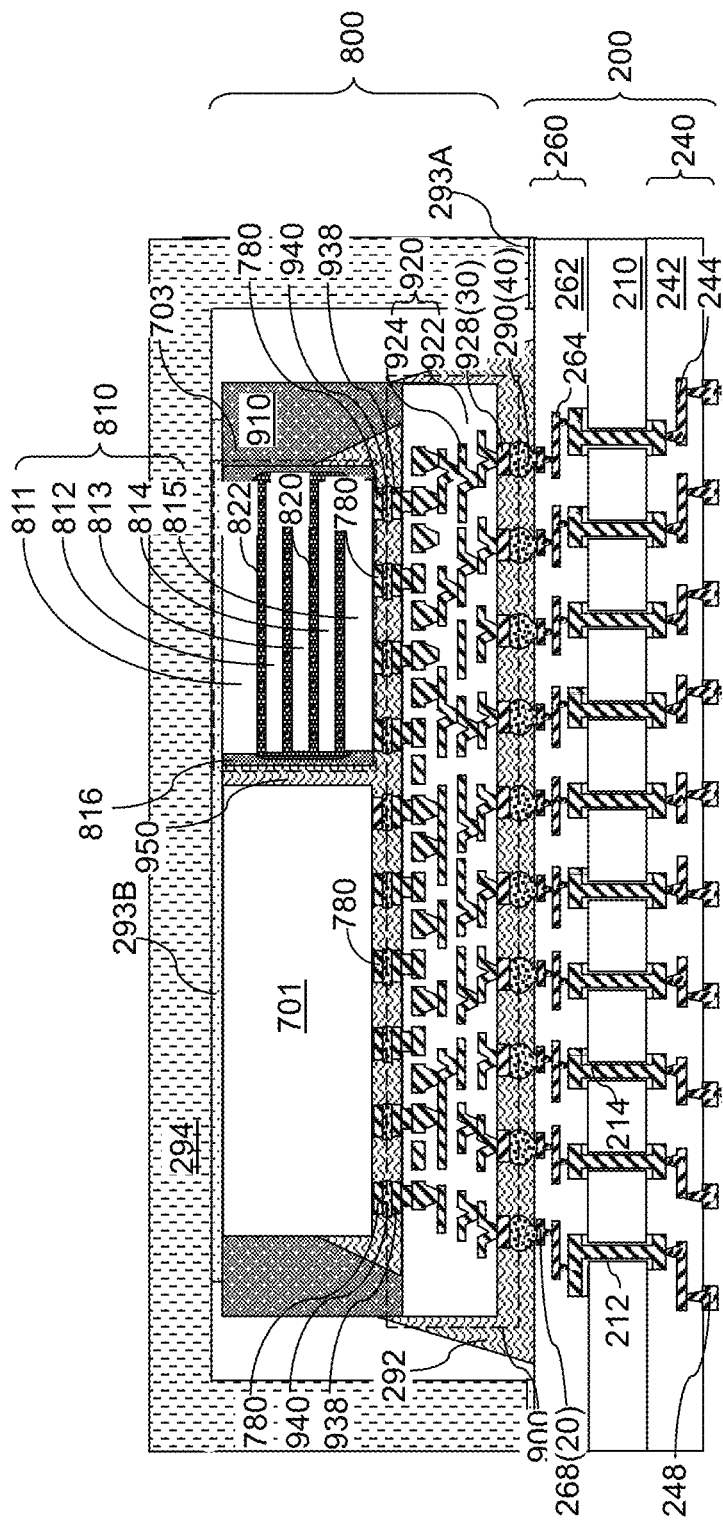
FIG. 22 is a vertical cross-sectional view of the structure after formation of a second underfill material portion and attachment of a stiffener structure according to an embodiment of the present disclosure.

Referring to FIGS. 22, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may be formed between the interposer 900 and the packaging substrate 200. The second underfill material portion 292 may contact each of the second solder material portions 290 (which may be C4 solder balls or C2 solder caps), and may contact vertical sidewalls of the fan-out package 800. The second underfill material portion laterally surrounds, and contacts, the array of second solder material portions 290 and the fan-out package 800.

Optionally, a stabilization structure 294, such as a cap structure or a ring structure, may be attached to the assembly of the fan-out package 800 and the packaging substrate 200 to reduce deformation of the assembly during subsequent processing steps and/or during usage of the assembly. The stabilization structure 294 may comprise a stiffener structure, and may be attached to the packaging substrate 200 using a first adhesive layer 293A and to the at least one semiconductor die (701, 703) using a second adhesive layer 293B.

In one embodiment, the fan-out package 800 comprises a molding compound die frame 910 that laterally surrounds the at least one semiconductor die (701, 703) and contacting a peripheral portion of a top surface of the interposer 900. The second underfill material portion 292 may be formed directly on sidewalls of the molding compound die frame 910.

Figure 23:
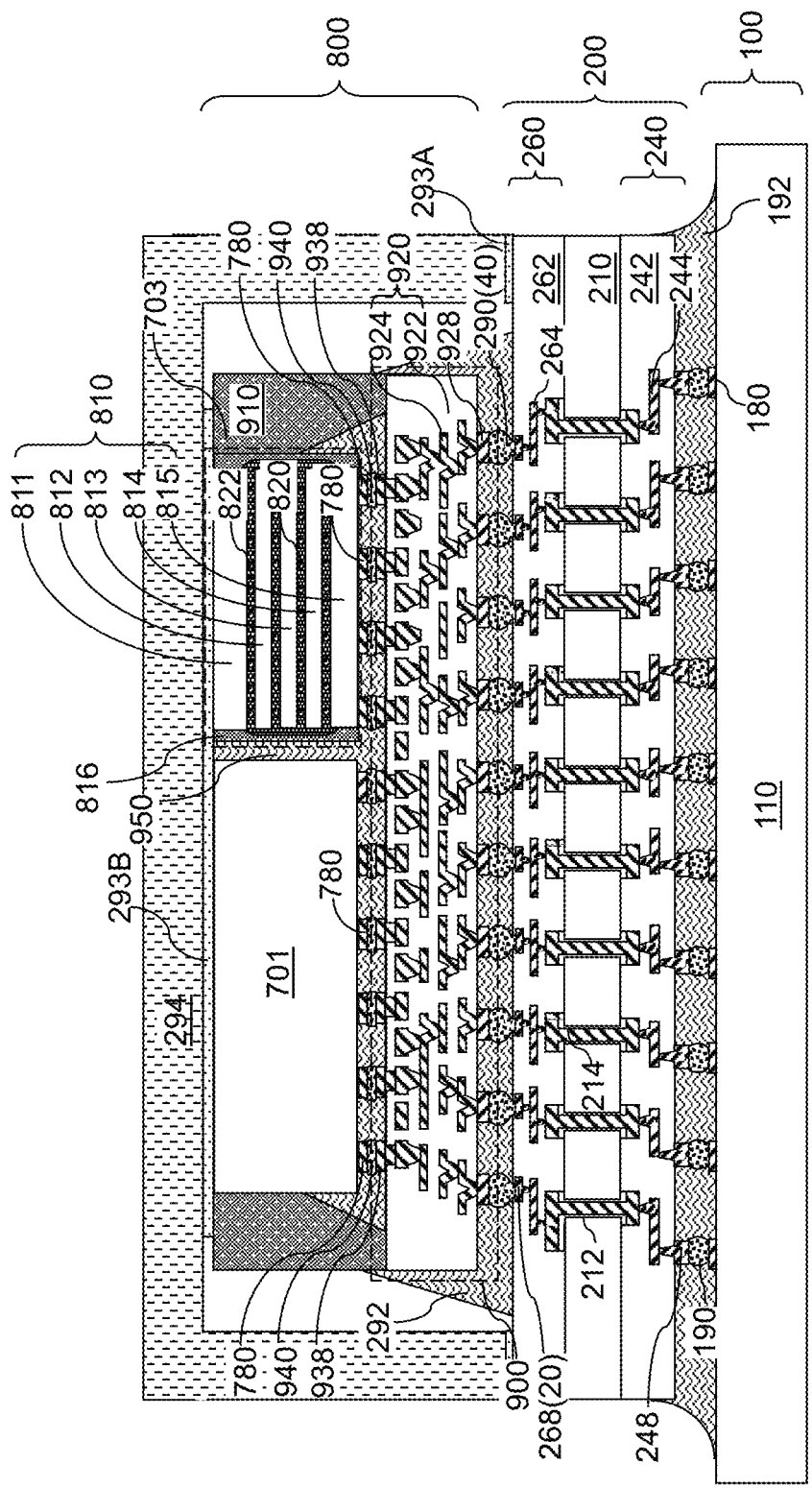
FIG. 23 is a vertical cross-sectional view of the structure after the packaging substrate is attached to a printed circuit board (PCB) according to an embodiment of the present disclosure.

Referring to FIG. 23, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The packaging substrate 200 is attached to the PCB 100 through the array of solder joints 190.

Figure 24:
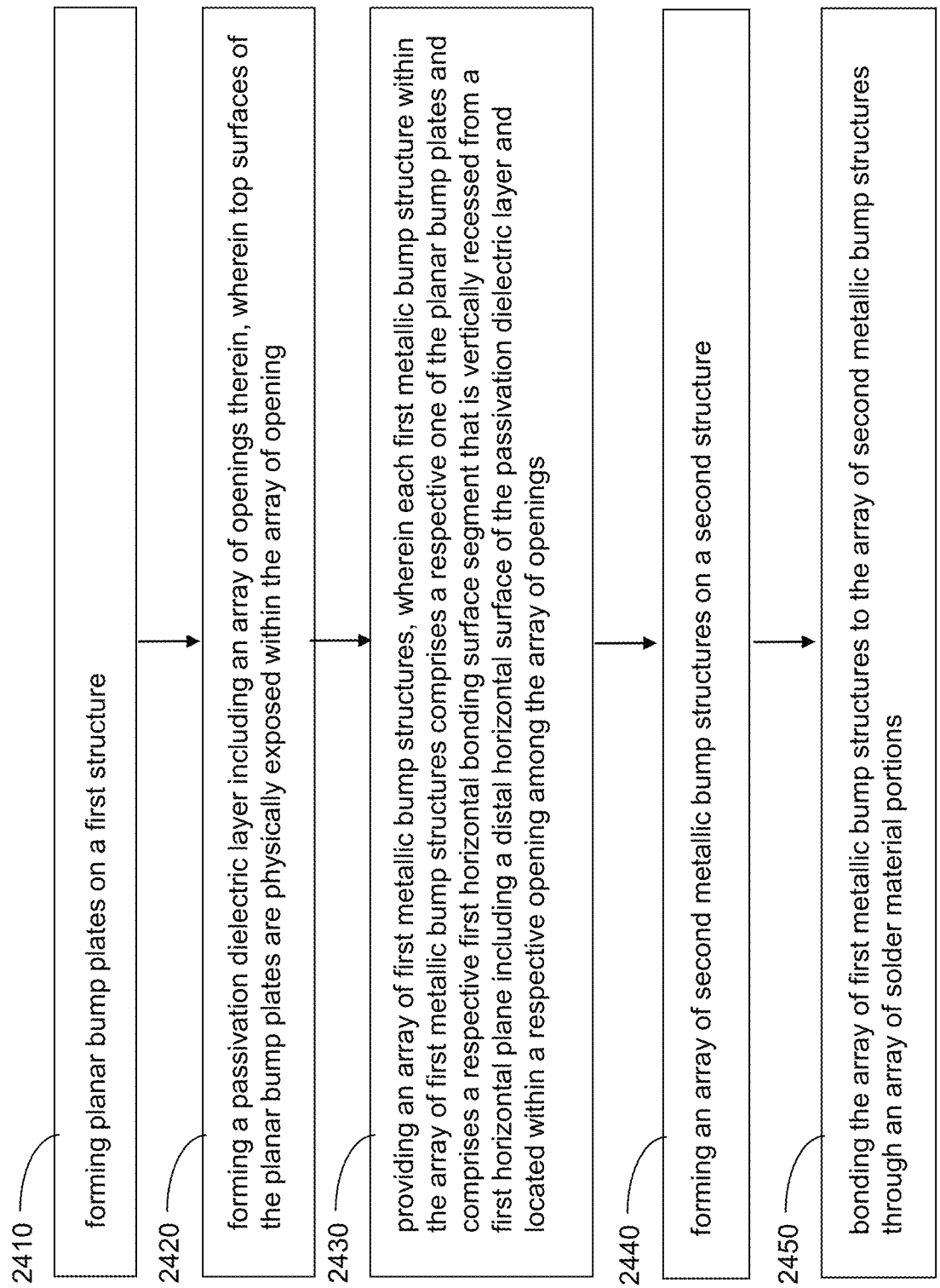
FIG. 24 is a flowchart illustrating steps for forming an structure according to an embodiment of the present disclosure.

FIG. 24 is a flowchart illustrating steps for forming a bonded assembly according to an embodiment of the present disclosure.

Referring to step 2410 and FIGS. 1A-3D, 4A-4D, and 5A-5E, and/or FIGS. 20A and 20B, base bump plates (21, 22, 24, 122) are formed on a first structure {900 or (701, 703, or 200)}.

Referring to step 2420 and FIGS. 3E, 4A-4D, and 5A-5E, and/or FIGS. and 20B, a passivation dielectric layer (9228, 7228, or 2628) including an array of openings therein is formed. Top surfaces of the base bump plates (21, 22, 24, 122) are physically exposed within the array of openings.

Referring to step 2430 and FIGS. 3F-3H, 4A-4D, and 5A-5E, and/or FIGS. 20A and 20B, an array of first metallic bump structures 20 is provided. Each first metallic bump structure 20 within the array of first metallic bump structures 20 comprises a respective one of the base bump plates (21, 22, 24, 122) and comprises a respective first horizontal bonding surface segment that is vertically recessed from a first horizontal plane HP1 including a distal horizontal surface of the passivation dielectric layer (9228, 7228, or 2628) and located within a respective opening selected from the array of openings.

Referring to step 2440 and FIGS. 6A-6C, 7A, 8A-8D, 9A-9E, 10A-10E, and 11A-11E, and/or FIG. 16, an array of second metallic bump structures 30 is formed on a second structure {(701, 703, or 200) or 900}.

Referring to step 2450 and FIGS. 7B, 8A-8D, 9A-9E, 10A-10E, 11A-11E, 12, 13A-13H, and 14A-23, the array of first metallic bump structures 20 may be bonded to the array of second metallic bump structures 30 through an array of solder material portions 40.

Referring to all drawings and according to various embodiments of the present disclosure, a bonded assembly is provided, which comprises a first structure {900 or (701, 703, or 200)} and a second structure {(701, 703, or 200) or 900} that are bonded to each other. The first structure {900 or (701, 703, or 200)} comprises first metallic connection structures 120 surrounded by first dielectric layers {922 or (722 or 262)}, the first dielectric layers {922 or (722 or 262)} comprising a passivation dielectric layer (9228, 7228, or 2628) that includes an array of openings therein, and further comprises an array of first metallic bump structures 20 electrically connected to the first metallic connection structures 120, comprising a respective nickel plate portion 24 having a peripheral region that is covered by the passivation dielectric layer (9228, 7228, or 2628) and having a center region that underlies a respective one of the openings in the passivation dielectric layer (9228, 7228, or 2628), and having a respective first horizontal bonding surface segment that is vertically recessed from a first horizontal plane HP1 including a distal horizontal surface of the passivation dielectric layer (9228, 7228, or 2628). The second structure {(701, 703, or 200) or 900} comprises second metallic connection structures 130 surrounded by second dielectric layers {(722 or 262) or 922}, and second metallic bump structures 30 electrically connected to the second metallic connection structures 130 and having a respective second horizontal bonding surface segment that protrudes from a second horizontal plane HP2 including a distal horizontal surface of an dielectric layer selected from the second dielectric layers {(722 or 262) or 922} that is most proximal to the first structure {900 or (701, 703, or 200)} toward the first structure {900 or (701, 703, or 200)}. The array of first metallic bump structures 20 is bonded to the array of second metallic bump structures 30 through an array of solder material portions 40.

In one embodiment, each second metallic bump structure 30 may comprise a first copper plate portion 32, a nickel plate portion 34, and a second copper plate portion 36. In one embodiment, horizontal cross-sectional shapes of the first copper plate portion 32, the nickel plate portion 34, and the second copper plate portion 36 may be the congruent among one another, and may overlap with one another in a plan view. In one embodiment, the first copper plate portion 32, the nickel plate portion 34, and the second copper plate portion 36 may have vertically coincident sidewalls, i.e., sidewalls located within a same vertical plane such as a cylindrical vertical plane.

In one embodiment, the sidewalls of the first copper plate portion 32, the nickel plate portion 34, and the second copper plate portion 36 may contact an underfill material portion (950 or 290). In one embodiment, an entirety of the sidewall of the first copper plate portion 32 and the entirety of the nickel plate portion 34 may contact the underfill material portion (950 or 290). A predominant fraction (i.e., more than 50%) of the sidewall of the second copper plate portion 36 may contact the underfill material portion (950 or 290). In one embodiment, each second metallic bump structure may comprise a metallic seed layer 31 in contact with the first copper plate portion 32 and in contact with the underfill material portion (950 or 290).

One of the second dielectric material layers {(722 or 262) or 922} contacts the underfill material portion (950 or 290). In some embodiments, the underfill material portion (950 or 290) may contact a cylindrical vertical sidewall or a tapered annular sidewall of the one of the second dielectric material layers {(722 or 262) or 922}. In some embodiments, each of the second metallic bump structures 20 may contact a cylindrical vertical sidewall or a tapered annular sidewall of the one of the second dielectric material layers {(722 or 262) or 922}.

In one embodiment, each of the second metallic bump structures 20 may comprise a copper plate portion 26 that contacts a respective solder material portion 40. In one embodiment, each of the second metallic bump structures 20 may comprise a nickel plate portion 24 that contacts a respective solder material portion 40. In one embodiment, each of the second metallic bump structures 20 may comprise an electrically-conductive-material plate portion (122, 126) in contact with a respective solder material portion 40. The electrically-conductive-material plate portion (122, 126) may comprise a highly electrically conductive material such as gold, silver, or copper. The nickel plate portion 24 or the electrically-conductive-material plate portion 122 may be formed as a planar structure having a planar top surface and a planar bottom surface and having sidewalls that have a same vertical extent, which is the vertical spacing between the planar top surface and the planar bottom surface. The copper plate portion 26 or the electrically-conductive-material plate portion 126 may be formed as a non-planar structure having a horizontally-extending portion and a vertically-extending portion adjoined to a periphery of the horizontally-extending portion and having a vertical or tapered sidewall in contact with one of the second dielectric material layers {(722 or 262) or 922}.

In one embodiment, bonding surfaces of the second metallic bump structures are more proximal to a third horizontal plane HP3 including the first horizontal bonding surface segment than the first horizontal plane HP1 is to the third horizontal plane HP3. In one embodiment, an entirety of the array of solder material portions 40 is located between the first horizontal plane HP1 and the third horizontal plane HP3.

In one embodiment, one of the second metallic bump structures 30 has a maximum lateral dimensional that is less than a maximum lateral dimension of one of the first horizontal bonding surface segments that the one of the second metallic bump structures 30 contacts. In one embodiment, one of the second metallic bump structures has a maximum lateral dimension that is less than a minimum lateral dimension of an opening selected from the array of openings in the passivation dielectric layer (9228, 7228, or 2628) within which the one of the second metallic bump structures 30 is located.

In one embodiment, each first metallic bump structure 20 20 within the array of first metallic bump structures 20 comprises a respective base bump plate (21, 22, 24, 122) having a bottom surface contacting a respective one of the first metallic connection structures 120, and having a top surface that is spaced from the bottom surface. In one embodiment, each first metallic bump structure 20 within the array of first metallic bump structures 20 comprises a respective contoured bump plate (25, 26, 126) containing a horizontally-extending bottom portion in contact with the base bump plate (21, 22, 24, 122) and a tapered or vertically-extending portion contacting a tapered or vertical sidewall of a respective opening selected from the array of openings in the passivation dielectric layer (9228, 7228, or 2628).

In one embodiment, the first horizontal bonding surface segments are surface segments of the horizontally-extending portions of the contoured bump plates (25, 26, 126). In one embodiment, the respective contoured bump plate (25, 26, 126) contains an annular horizontally-extending portion having an inner periphery that is adjoined to a top portion of the tapered or vertically-extending portion of the respective contoured bump plate (25, 26, 126). In one embodiment, the first horizontal bonding surface segments are surface segments of the base bump plates (21, 22, 24, 122).

In one embodiment, the bonded assembly comprises an underfill material portion (950 or 292) laterally surrounding the array of solder material portions 40, wherein the underfill material portion (950 or 292) is in contact with the first horizontal bonding surface segments. In one embodiment, each first metallic bump structure 20 within the array of first metallic bump structures 20 comprises a respective contoured bump plate (25, 26, 126) contacting the passivation dielectric layer (9228, 7228, or 2628) at the openings in the passivation dielectric layer (9228, 7228, or 2628); and each opening within the array of openings comprises a tapered or vertical dielectric surface of the passivation dielectric layer (9228, 7228, or 2628) that is spaced from the underfill material portion (950 or 292) by a respective one of the contoured bump plates (25, 26, 126).

In one embodiment, each opening within the array of openings comprises a tapered or vertical dielectric surface of the passivation dielectric layer (9228, 7228, or 2628) that contacts the underfill material portion (950 or 292).

According to another aspect of the present disclosure, a bonded assembly is provided, which comprises a first structure {900 or (701, 703, or 200)} and a second structure {(701, 703, or 200) or 900} that are bonded to each other. In one embodiment, the first structure {900 or (701, 703, or 200)} comprises first metallic bump structures 20; the second structure {(701, 703, or 200) or 900} comprises second metallic bump structures 30; each first metallic bump structure 20 within the first metallic bump structures 20 comprises a respective nickel plate portion 24 having a peripheral region that is covered by a passivation dielectric layer (9228, 7228, or 2628) and having a center region that underlies a respective opening in the passivation dielectric layer (9228, 7228, or 2628), and has a respective first horizontal bonding surface segment that is vertically recessed away from the second structure {(701, 703, or 200) or 900} from a first horizontal plane HP1 including a horizontal dielectric surface of the first structure {900 or (701, 703, or 200)} that is most proximal to the second structure {(701, 703, or 200) or 900} selected from horizontal dielectric surfaces of the first structure {900 or (701, 703, or 200)}; each second metallic bump structure within the second metallic bump structures 30 has a respective second horizontal bonding surface segment that protrudes toward the first structure {900 or (701, 703, or 200)} from a second horizontal plane HP2 including a horizontal dielectric surface of the second structure {(701, 703, or 200) or 900} that is most proximal to the first structure {900 or (701, 703, or 200)} selected from horizontal dielectric surfaces of the second structure {(701, 703, or 200) or 900}; and the array of first metallic bump structures 20 is bonded to the array of second metallic bump structures 30 through an array of solder material portions 40.

In one embodiment, one of the first structure {900 or (701, 703)} and the second structure {(701, 703) or 900} comprises a semiconductor die (701 or 703); and another of the first structure {900 or (701, 703)} and the second structure {(701, 703) or 900} comprises an interposer 900.

The various embodiments of the present disclosure provide bridging-resistant bump structures that limits a bump shift range, and avoids bump bridging that leads to unintended electrical connection between bump structures. Particularly, the recessed first horizontal bonding surface segments of the first metallic bump structures 20 provide lateral confinement of second metallic bump structures 30 and solder material portions 40. The various embodiments of the present disclosure widens the processing window for a bumping process, and provide fine pitch bumping. The various embodiments of the present disclosure provide low height, lightweight, short vertical interconnections with enhanced reliability and power integrity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bonded assembly comprising a first structure and a second structure that are bonded to each other, wherein:
   the first structure comprises first metallic connection structures surrounded by first dielectric layers, the first dielectric layers comprising a passivation dielectric layer that includes openings therein, and further comprises first metallic bump structures electrically connected to the first metallic connection structures, comprising a respective nickel plate portion having a peripheral region that is covered by, and is directly contacted by, the passivation dielectric layer and having a center region that underlies a respective one of the openings in the passivation dielectric layer, and having a respective first horizontal bonding surface segment that is vertically recessed from a first horizontal plane including a distal horizontal surface of the passivation dielectric layer;
   the second structure comprises second metallic connection structures surrounded by second dielectric layers, and second metallic bump structures electrically connected to the second metallic connection structures and having a respective second horizontal bonding surface segment that protrudes toward the first structure from a second horizontal plane including a distal horizontal surface of one of the second dielectric layers, the one of the second dielectric layers being most proximal to the first structure among the second dielectric layers; and
   the first metallic bump structures are bonded to the second metallic bump structures through solder material portions.

2. The bonded assembly of claim 1, wherein bonding surfaces of the second metallic bump structures are more proximal to a third horizontal plane including the first horizontal bonding surface segment than the first horizontal plane is to the third horizontal plane.

3. The bonded assembly of claim 2, wherein an entirety of the solder material portions is located between the first horizontal plane and the third horizontal plane.

4. The bonded assembly of claim 1, wherein one of the second metallic bump structures has a maximum lateral dimensional that is less than a maximum lateral dimension of one of the first horizontal bonding surface segments that the one of the second metallic bump structures contacts.

5. The bonded assembly of claim 1, wherein one of the second metallic bump structures has a maximum lateral dimension that is less than a minimum lateral dimension of an opening selected from the openings in the passivation dielectric layer within which the one of the second metallic bump structures is located.

6. The bonded assembly of claim 1, wherein each first metallic bump structure within the first metallic bump structures comprises a respective base bump plate having a bottom surface contacting a respective one of the first metallic connection structures, and having a top surface that is spaced from the bottom surface.

7. The bonded assembly of claim 6, wherein each first metallic bump structure within the first metallic bump structures comprises a respective contoured bump plate containing a horizontally-extending bottom portion in contact with the base bump plate and a tapered or vertically-extending portion contacting a tapered or vertical sidewall of a respective opening selected from the openings in the passivation dielectric layer.

8. The bonded assembly of claim 7, wherein the first horizontal bonding surface segments are surface segments of the horizontally-extending bottom portions of the contoured bump plates.

9. The bonded assembly of claim 7, wherein the respective contoured bump plate contains an annular horizontally-extending portion having an inner periphery that is adjoined to a top portion of the tapered or vertically-extending portion of the respective contoured bump plate.

10. The bonded assembly of claim 6, wherein the first horizontal bonding surface segments are surface segments of the base bump plates.

11. The bonded assembly of claim 6, further comprising an underfill material portion laterally surrounding the solder material portions, wherein the underfill material portion is in contact with the first horizontal bonding surface segments.

12. The bonded assembly of claim 11, wherein:
each first metallic bump structure within the first metallic bump structures comprises a respective contoured bump plate contacting the passivation dielectric layer at the openings in the passivation dielectric layer; and
each opening within the openings comprises a tapered or vertical dielectric surface of the passivation dielectric layer that is spaced from the underfill material portion by a respective one of the contoured bump plates.

13. The bonded assembly of claim 11, wherein each opening within the openings comprises a tapered or vertical dielectric surface of the passivation dielectric layer that contacts the underfill material portion.

14. A bonded assembly comprising a first structure and a second structure that are bonded to each other, wherein:
the first structure comprises first metallic bump structures;
the second structure comprises second metallic bump structures;
each first metallic bump structure within the first metallic bump structures comprises a respective nickel plate portion having a peripheral region that is covered by, and is directly contacted by, a passivation dielectric layer and having a center region that underlies a respective opening in the passivation dielectric layer, and has a respective first horizontal bonding surface segment that is vertically recessed away from the second structure from a first horizontal plane including a horizontal dielectric surface of the first structure that is most proximal to the second structure selected from horizontal dielectric surfaces of the first structure;
each second metallic bump structure within the second metallic bump structures has a respective second horizontal bonding surface segment that protrudes toward the first structure from a second horizontal plane including a horizontal dielectric surface of the second structure that is most proximal to the first structure selected from horizontal dielectric surfaces of the second structure; and
the first metallic bump structures are bonded to the second metallic bump structures through solder material portions.

15. The bonded assembly of claim 14, wherein:
one of the first structure and the second structure comprises a semiconductor die; and
another of the first structure and the second structure comprises an interposer.

16. A bonded assembly comprising a first structure and a second structure that are bonded to each other, wherein:
the first structure comprises first metallic connection structures surrounded by first dielectric layers, the first dielectric layers comprising a passivation dielectric layer that includes openings therein, and further comprises first metallic bump structures electrically connected to the first metallic connection structures, comprising a respective nickel plate portion having a peripheral region that is covered by, and is directly contacted by, a passivation dielectric layer, and having a respective first horizontal bonding surface segment that is vertically recessed from a first horizontal plane including a distal horizontal surface of the passivation dielectric layer;
the second structure comprises second metallic connection structures surrounded by second dielectric layers, and second metallic bump structures electrically connected to the second metallic connection structures and having a respective second horizontal bonding surface segment that protrudes from a second horizontal plane including a distal horizontal surface of the second dielectric layers that is most proximal to the first structure toward the first structure; and
the first metallic bump structures are bonded to the second metallic bump structures through solder material portions.

17. The bonded assembly of claim 16, wherein one of the second metallic bump structures has a maximum lateral dimension that is less than a minimum lateral dimension of an opening selected from the openings in the passivation dielectric layer within which the one of the second metallic bump structures is located.

18. The bonded assembly of claim 16, wherein each first metallic bump structure within the first metallic bump structures comprises a respective base bump plate having a bottom surface contacting a respective one of the first metallic connection structures, and having a top surface that is spaced from the bottom surface.

19. The bonded assembly of claim 18, wherein each first metallic bump structure within the first metallic bump structures comprises a respective contoured bump plate containing a horizontally-extending bottom portion in contact with the base bump plate and a tapered or vertically-extending portion contacting a tapered or vertical sidewall of a respective opening selected from the openings in the passivation dielectric layer.

20. The bonded assembly of claim 18, further comprising an underfill material portion laterally surrounding the solder material portions, wherein the underfill material portion is in contact with the first horizontal bonding surface segments.

* * * * *